(12) United States Patent
Alami et al.

(10) Patent No.: US 7,791,921 B2
(45) Date of Patent: Sep. 7, 2010

(54) ROM ARRAY WITH SHARED BIT-LINES

(75) Inventors: Salwa Bouzekri Alami, Aix en Provence (FR); Lotfi Ben Ammar, Marseilles (FR)

(73) Assignee: Atmel Corporation, San Jose, CA (US)

( * ) Notice: Subject to any disclaimer, the term of this patent is extended or adjusted under 35 U.S.C. 154(b) by 154 days.

(21) Appl. No.: 12/136,400

(22) Filed: Jun. 10, 2008

(65) Prior Publication Data

US 2009/0303769 A1    Dec. 10, 2009

(51) Int. Cl.
*G11C 5/06* (2006.01)
(52) U.S. Cl. ........................................ 365/63
(58) Field of Classification Search .................... 365/63, 365/98, 104
See application file for complete search history.

(56) References Cited

U.S. PATENT DOCUMENTS 7,002,827 B1 * 2/2006 Sabharwal et al. ............ 365/94
7,031,179 B2   4/2006 Yon et al.
2005/0174841 A1 * 8/2005 Ho ........................ 365/185.03
2006/0239071 A1 * 10/2006 Ohta ...................... 365/185.02

OTHER PUBLICATIONS

"High Density Non-Volatile Memory Array", U.S. Appl. No. 11/749,428, filed May 16, 2007, 45 pages.

* cited by examiner

*Primary Examiner*—Hoai V Ho
*Assistant Examiner*—Anthan T Tran
(74) *Attorney, Agent, or Firm*—Schwegman, Lundberg & Woessner, P.A.

(57) ABSTRACT

Electronic apparatus, methods of forming the electronic apparatus, and methods of operating the electronic apparatus include a read only memory having a memory array of bit-lines, where the bit-lines are arranged such that each bit-line has a shared arrangement with one or more other bit-lines of the memory array. Each shared arrangement is structured to operably store a plurality of bits.

6 Claims, 15 Drawing Sheets

ROM ARRAY WITH SHARED BIT-LINES

TECHNICAL FIELD

This disclosure relates generally to apparatus having a read only memory.

BACKGROUND

The electronics industry has a market driven need to increase the capacity and efficiency of devices used in products such as, but not limited to, control systems for industrial systems and for customer-related systems, information handing systems such as computers and mobile telephones, processor chips, and memory devices. Such increase in capacity and efficiency of products may be addressed through enhanced structures for memories, such as a read only memory (ROM), that are utilized in various products.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration, various embodiments. These embodiments are described in sufficient detail to enable those skilled in the art to practice these and other embodiments. Other embodiments may be utilized, and structural, logical, and electrical changes may be made to these embodiments. Various embodiments are not necessarily mutually exclusive, as some embodiments can be combined with one or more other embodiments to form new embodiments. The following detailed description is, therefore, not to be taken in a limiting sense.

Figure 1:
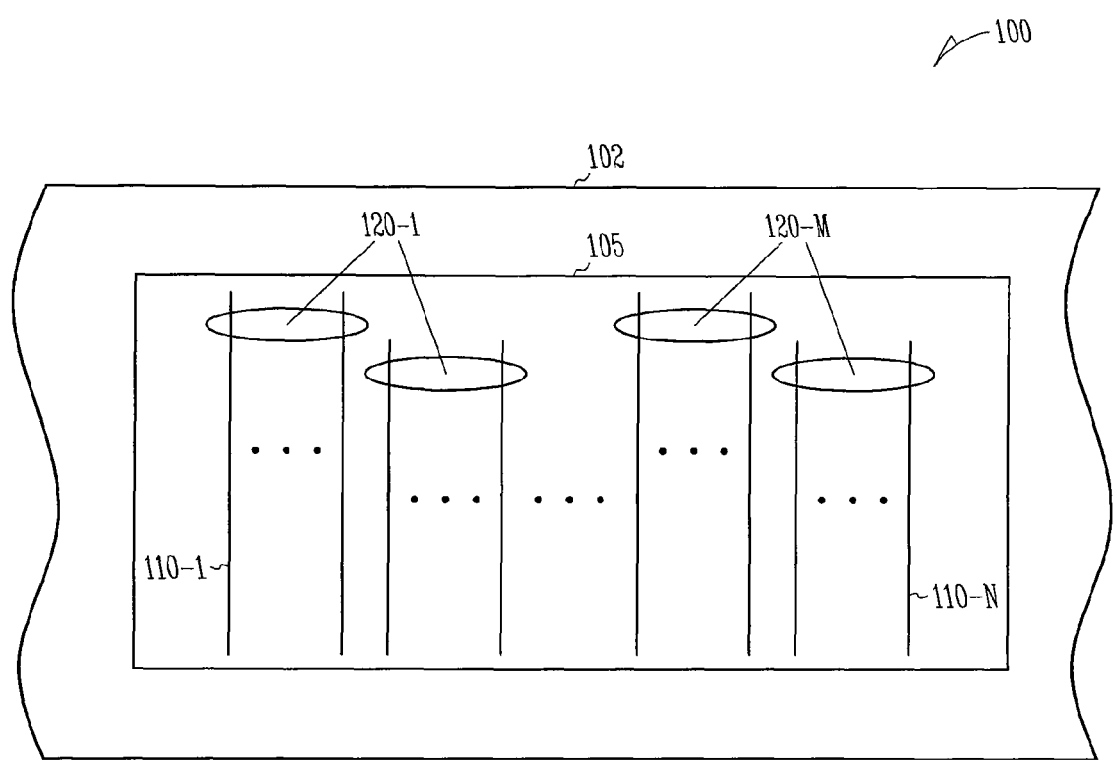
FIG. 1 depicts some embodiments of an apparatus that include a read only memory on a substrate, where the read only memory has a memory array of bit-lines such that the bit-lines are arranged so that each bit-line has a shared arrangement with one or more other bit-lines of the memory array.

FIG. 1 depicts an embodiment of an apparatus 100 that includes a read only memory 105 on a substrate 102, where read only memory 105 has a memory array of bit-lines 110-1 . . . 110-N such that the bit-lines 110-1 . . . 110-N are arranged so that each bit-line has a shared arrangement with one or more other bit-lines of the memory array. In a shared arrangement of bit-lines, the bit-lines are used together to read data stored in the shared arrangement of bit-lines. For example, with a bit stored using one bit-line, the bit may be read using the one bit-line with another bit-line to read the stored bit, defining a shared arrangement for this example. The shared arrangement of bit-lines depends on the number of bits to be stored and read. For example, in various embodiments, an arrangement in a memory array of a ROM may include a number, n, of bit-lines associated with a bit-cell and n bit-lines associated with an adjacent bit-cell to store data, where the data is represented by n bits having $2^n$ possible values. Additional lines arranged as bit-lines in the memory array may be used to read data depending on the number, n, of bit-lines used to store data. Each shared arrangement 120-1 . . . 120-M in the memory array of the ROM is operable to store a plurality of bits. Each bit may be a binary 1 or 0. In an embodiment, each shared arrangement has a number of shared bit-lines such that the plurality of stored bits equals the number of shared bit-lines. The plurality of bits may be provided as data bits that may be used by a controller, such as a processor, in the performance a task of the apparatus.

In various embodiments, a ROM memory array with shared bit-lines includes a plurality of bit-cells, where each bit-cell is coupled to a word-line and is associated with a plurality of bit-lines. A bit-cell may include one of more devices that use the bit-lines and word-line to store and read bits. The bit-cell may include a single transistor connected to the plurality of bit-lines and the word-line. In an embodiment, each bit-line may be shared between two bit-cells and each bit-cell may be attached to several bit-lines. Each bit-line and the one or more other bit-lines in the shared arrangement may share a bit-cell. The number of bit-lines multiplied by the number of word-lines gives the total capacity of the ROM memory array. Data is accessed by accessing a given bit-line and word-line, which, depending on how the ROM memory array is programmed, accesses the corresponding bit-cell that is shared between different bit-lines. With the memory array arranged with x number of rows and y number of columns in such a shared matter, x*y/n bit-cells may be constructed in the memory array, where n is the number of bit-lines shared by each bit-cell. A ROM memory array with shared bit-lines can be implemented using less bit-cells, where each bit-cell includes a transistor, than in a conventional architecture having a ROM array with x lines and y columns and x*y bit-cells with each bit-cell having a transistor.

In various embodiments, a ROM memory array with shared bit-lines reduces the number of bit-cells by storing more than one bit relative to one bit-cell, which can enhance the density of the ROM and aid in reducing chip cost. Such embodiments of a ROM architecture can be implemented without using waived rules to reduce the area of the bit-cell and without using a multi-level approach in which more than one data bit is stored into a one bit bit-cell using additional masks. For some applications, the multi-level approach and/or the waived rules approach may be implemented in conjunction with various embodiments of a ROM memory array with shared bit-lines. A ROM array with shared bit-lines implemented in various embodiments can provide high density of devices in the memory array as compared to conventional ROM memory arrays. In addition, a process for fabricating embodiments may provide enhanced yield in processing and process portability from the robust design of such ROM architectures.

Architectures for Shared Arrangements

Figure 2A:
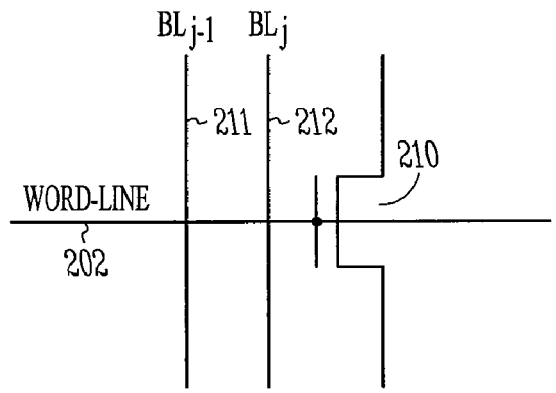
FIGS. 2A-2C depict examples for a structure having two bit-lines associated to a transistor per bit-cell, according to the teachings of various embodiments.
Figure 2B:
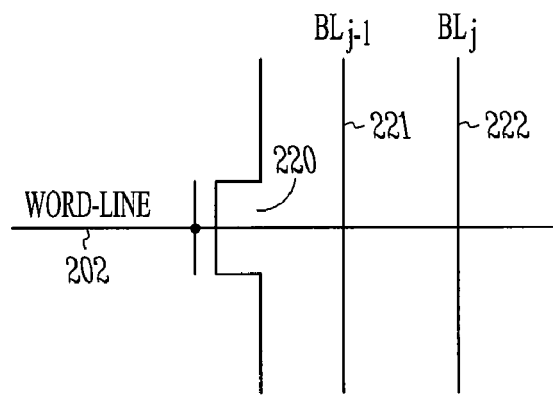
Figure 2C:
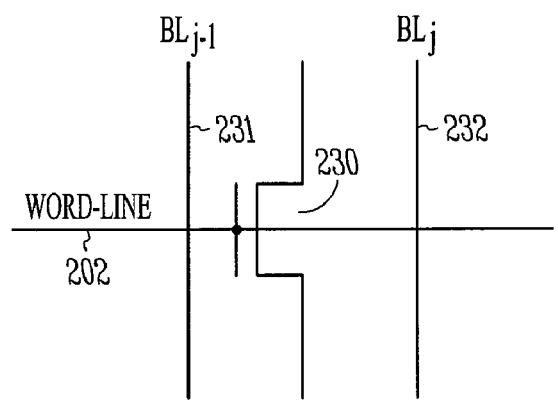

FIGS. 2A-2C depict example embodiments for a structure having a transistor associated with two bit-lines and one word-line per bit-cell for use in a shared arrangement. As an example, the structures are shown coupled to the same word-line 202 to show various embodiments that may be implemented in a ROM array with shared bit-lines. FIG. 2A shows a transistor 210 coupled to word-line 202 with both bit-lines 211 and 212 on the left side of transistor 210. FIG. 2B shows a transistor 220 coupled to word-line 202 with both its associated bit-lines 221 and 222 on the right side of transistor 220. FIG. 2C shows a transistor 230 coupled to word-line 202 with one associated bit-line 231 on the left side of transistor 230 and one associated bit-line 232 on the right side of transistor 230.

With two bit-lines per bit-cell, two data bits representing one of four digital values, ('00' '01' '10' '11'), can be stored in one selected bit-cell. To program such a bit-cell two additional bit lines can be used. These additional bit-lines may be bit-lines of an adjacent bit-cell. For an embodiment with two bit-lines per bit-cell, two bit-lines of one or more adjacent cells are used in a shared arrangement, depending on the basic structure used for the bit-cell. Sharing bit-lines with other bit-lines allows for the avoidance or reduction in overhead in the provision of bit-lines. These bit-lines, shared from other bit-lines per bit-cell, are used to store and read the two data bits without additional bit-lines except at the ends of a word-line. In an embodiment, two additional bit-lines may be used to store and read the data of the last (or the first) bit-cell on each word-line for the whole memory array.

Figure 3A:
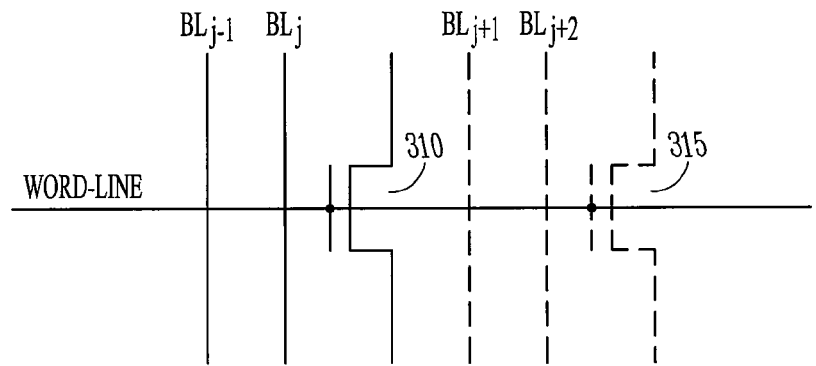
FIGS. 3A-3C depict examples for a shared arrangement using structures having a transistor associated to two bit-lines and one word-line per bit-cell as shown in the example embodiments depicted in FIGS. 2A-2C, according to the teachings of various embodiments.
Figure 3B:
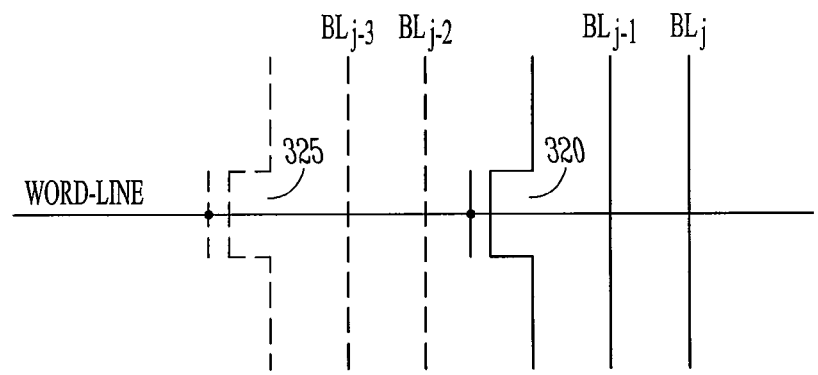
Figure 3C:
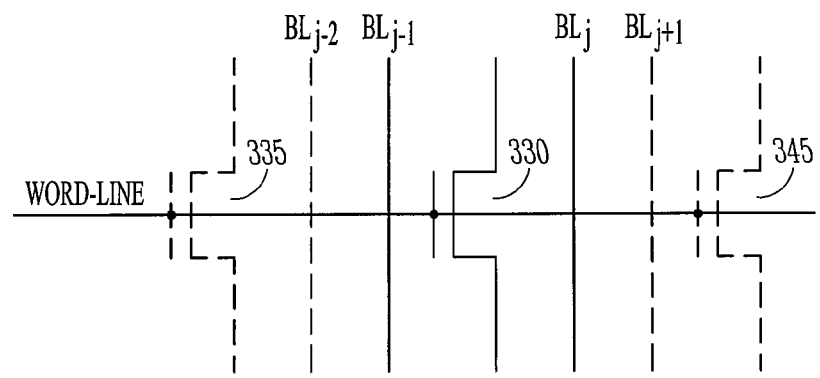

FIGS. 3A-3C depict example embodiments for a shared arrangement using structures having a transistor per bit-cell associated with two bit-lines and one word-line as shown in the example embodiments depicted in FIGS. 2A-2C. FIG. 3A shows a basic structure for a bit-cell 310, as shown in FIG. 2A, in a shared arrangement with an adjacent bit-cell 315 on the right (in dashed lines). The bit-lines $BL_{j-1}$ and $BL_j$ associated to the bit-cell j 310 and the bit-lines $BL_{j+1}$ and $BL_{j+2}$ associated to adjacent bit-cell j+1 315 are used by bit-cell 310 to store data. $BL_{j+1}$ and $BL_{j+2}$ are used with $BL_{j-1}$ and $BL_j$ to store and read the data from the bit-cell j 310. $BL_{j+1}$ and $BL_{j+2}$ are used to store and read the data form the bit-cell j+1 315 with shared assistance of bit-lines associated with the bit-cell adjacent to bit-cell j+1 315 on its right. Other basic cell structures with associated bit-lines may be used.

FIG. 3B shows a basic structure for a bit-cell 320, as shown in FIG. 2B, in a shared arrangement with an adjacent bit-cell 325 on the left (in dashed lines). $BL_{j-1}$ and $BL_j$ are the bit-lines assigned to the bit-cell j 320, while $BL_{j-2}$ and $BL_{j-3}$ are the bit-lines associated with the adjacent bit-cell j–1 325. $BL_{j-2}$ and $BL_{j-3}$ are used with $BL_{j-1}$ and $BL_j$ to store and read the data form the bit-cell j 320. $BL_{j-2}$ and $BL_{j-3}$ are used to store and read the data from the bit-cell j–1 325 with shared assistance of bit-lines associated with the bit-cell adjacent to bit-cell j–1 325 on its left.

FIG. 3C shows a basic structure for a bit-cell 330, as shown in FIG. 2C, in a shared arrangement with bit-cell 335 on its left and bit-cell 345 on its right in which one bit-line associated with bit-cell 335 and one bit-line associated with bit-cell 345 are used. As with the arrangement shown in FIGS. 3A and 3B, two shared bit-lines are used with the bit-lines of bit-cell 330 to store and read data. Further, two additional bit-lines can be used to store and read the data of the last and the first bit-cells on each word-line for the whole memory array. In FIG. 3C, $BL_{j-1}$ and $BL_j$ are the bit-lines associated with the bit-cell j 330, while $BL_{j-2}$ is one of the two bit-lines associated with the adjacent bit-cell j–1 335 and $BL_{j+1}$ is one of the two bit-lines associated with the adjacent bit-cell j+1 345. $BL_{j-2}$ and $BL_{j+1}$ in conjunction with $BL_{j-1}$ and $BL_j$ of bit-cell 330 are used to store and read the data from the bit-cell j 330. $BL_{j-2}$ with the second bit-line associated with bit-cell j–1 335, in conjunction with one bit-line from each of the bit-cells adjacent to bit-cell j–1 335, is used to store and read the data from bit-cell j–1 335. $BL_{j+1}$ with the second bit-line associated with bit-cell j+1 345, in conjunction with one bit-line from each of the bit-cells adjacent to bit-cell j+1 345, is used to store and read the data from bit-cell j+1 345.

In various embodiments, a ROM architecture may include shared bit-lines in which a bit-cell is associated with one bit-line and shares another bit-line with an adjacent cell. In such architectures, there is only one bit stored in each bit-cell. A bit-cell/bit-line arrangements for n=1 shared bit-lines are similar to those illustrated in FIGS. 2A and 2B, except only one bit-line is associated with a bit-cell. A bit-cell/bit-line arrangements for n=1 shared bit-lines with an adjacent are similar to those illustrated in FIGS. 3A and 3B, except only one bit-line is associated with each bit-cell.

Figure 4A:
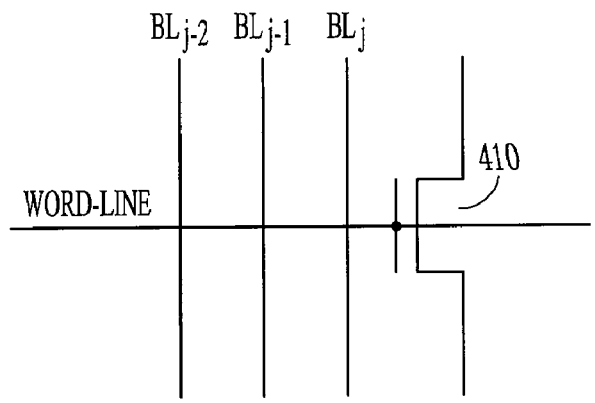
FIGS. 4A-4B depict examples for a structure having a transistor per bit-cell associated with three bit-lines and one word-line for use in a shared arrangement, according to various embodiments.
Figure 4B:
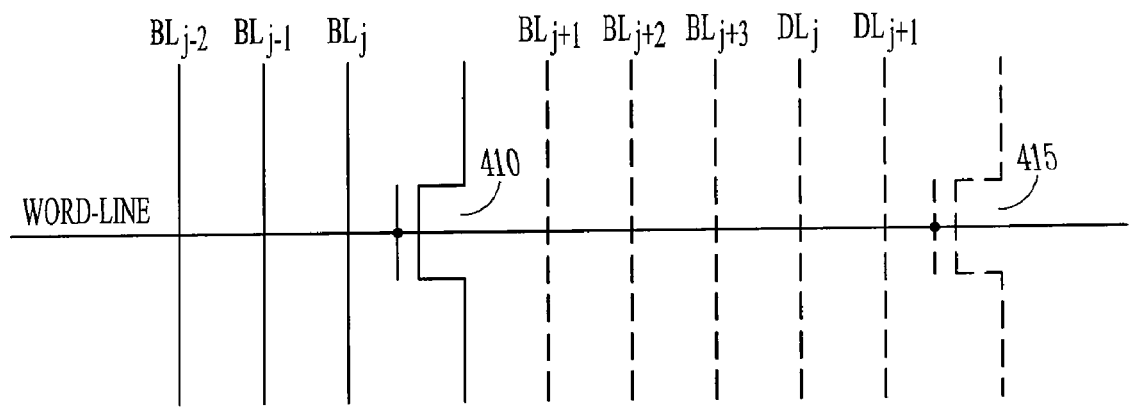

FIGS. 4A-4B depict examples for a structure having a transistor associated with three bit-lines and one word-line per bit-cell for use in a shared arrangement, according to various embodiments. As with the architecture with the number of associated bit-lines with a bit-cell being n=2, there are various possible structures for the location of the three bit-lines with respect to an associated transistor. FIG. 4A shows three bit-lines to the left of transistor 410. Alternatively, the three bit-lines associated with transistor 410 may be on the right of transistor 410 or the three bit-lines associated with transistor 410 may be distributed among the right and left sides of transistor 410. For convenience, the three-bit configurations other than the one demonstrated in FIG. 4A are not shown. Three bit lines associated with a bit-cell may be used to store eight data ("000" "001" "010" "011" "100" "101" "110" "111") can be stored in such a bit-cell.

FIG. 4B shows three bit-lines associated with a bit-cell 410 and bit-lines associated with an adjacent bit-cell 415 along with additional bit-lines to program bit-cell 410. The three bit-lines associated with the two bit-cells are used to store $2^3$ (8) bits. Eight bits may be associated with 8 bit-lines. In addition to the three bit-lines of each bit-cell, two additional bit-lines are used. Without sharing bit-lines between bit-cells, the number of bit-lines associated with each bit-cell would increase from 4 to 8. To program one of the eight data values, 5 additional bit-lines are used with the three bit-lines associated with a bit-cell 410. As shown in FIG. 4B, the three adjacent existing bit-lines on the right side associated with bit-cell 415 and two additional bit-lines are used in order to reduce overhead. Existing bit-lines refers to bit-lines correlated to bit-cells and the number of shared bit-lines correlated to stored data. In such a configuration, there are only j+3 additional bit-lines used to store and read the data of each bit-cell on each word-line for the whole memory array, where j is the number of bit-cells on each line and j is an exponent of 2. Though there are other possible locations of the additional bit-lines, to focus on discussion of an example embodiment for n=3 bit-lines associated with a bit-cell, these other configurations are not shown. In FIG. 4B, $BL_{j-2}$, $BL_{j-1}$, and $BL_j$ are the bit-lines associated to bit-cell j 410. $BL_{j+1}$, $BL_{j+2}$, and $BL_{j+3}$ are the bit-lines associated to the adjacent bit-cell j+1 415. $DL_j$ and $DL_{j+1}$ are the added bit-lines so that $BL_{j+1}$, $BL_{j+2}$, $BL_{j+3}$, $DL_j$ and $DL_{+1}$ are used to store and read the data from the bit-cell j 410 (and bit-cell j+1 415). Reading on each target bit-line is made through 4 bit-lines (reading bit-lines) including the target bit-line. A target bit-line is a bit-line whose associated stored data is to be read, while the reading bit-lines are used to read the data associated with the target bit-line.

In various embodiments, in ROM array architectures in which the number of shared bit-lines is n>3, each bit-cell, which may be realized by a transistor, is associated to n bit-lines and one word-line such that $2^n$ data values can be stored in such a bit-cell. The bit-cell may be configured in a shared arrangement in which $2^n$−n bit-lines in addition to the n bit-lines associated with the bit-cell are provided to program such a bit-cell. Without sharing between bit-cells, the number of bit-lines associated with each bit-cell would increase from $2^{n-1}$ to $2^n$. To reduce overhead, the bit-cell shares n existing bit-lines associated with an adjacent bit-cell and $2^n-2*n$ additional bit-lines. In such a configuration, there are only $j \times (2^n-1-n)+n$, if j is an exponent of 2 and $(j+1) \times (2^n-2n)/n$ if not, additional bit-lines used to store and read the data of each bit-cell on each word-line for the whole memory array, where j is the number of bit-cells on each line.

Compared to a classical ROM array, various embodiments of the invention include bit-cells that do not use a ground line. In various embodiments, the source and the drain of the transistor of each bit-cell is shared with the adjacent upper and lower bit-cells (horizontal being along a word-line line coupled to gates of transistors in bit-cells in a row and vertical being upper and lower bit-cells in a column). For such an array, programming a bit-cell depends on the contents of the bit-cell and the last programmed bit-cell.

FIGS. 1-4B illustrate examples of various embodiments for a ROM array in which bit-lines are in a shared arrangement with bit-cells. In various embodiments, n bit-lines are associated with a primary bit-cell, n bit-lines are shown associated with one or more bit-cells in shared arrangement with the primary bit-cell, and $2^n-2*n$ additional lines to store and read n bits relative to the primary bit-cell. Each bit-cell in the ROM array may be configured as a primary bit-cell relative to its associated bit-lines and shared arrangement of bit-lines and additional bit-lines. Making connections from each transistor of each bit-cell to appropriate bit-lines programs the ROM array. Reading of the data in the ROM array is realized by sensing the connections made in programming the ROM. Structures in addition to the ROM array that are constructed to read the data in the ROM array depend on the technique used to sense or determine the connections made in programming.

Figure 5A:
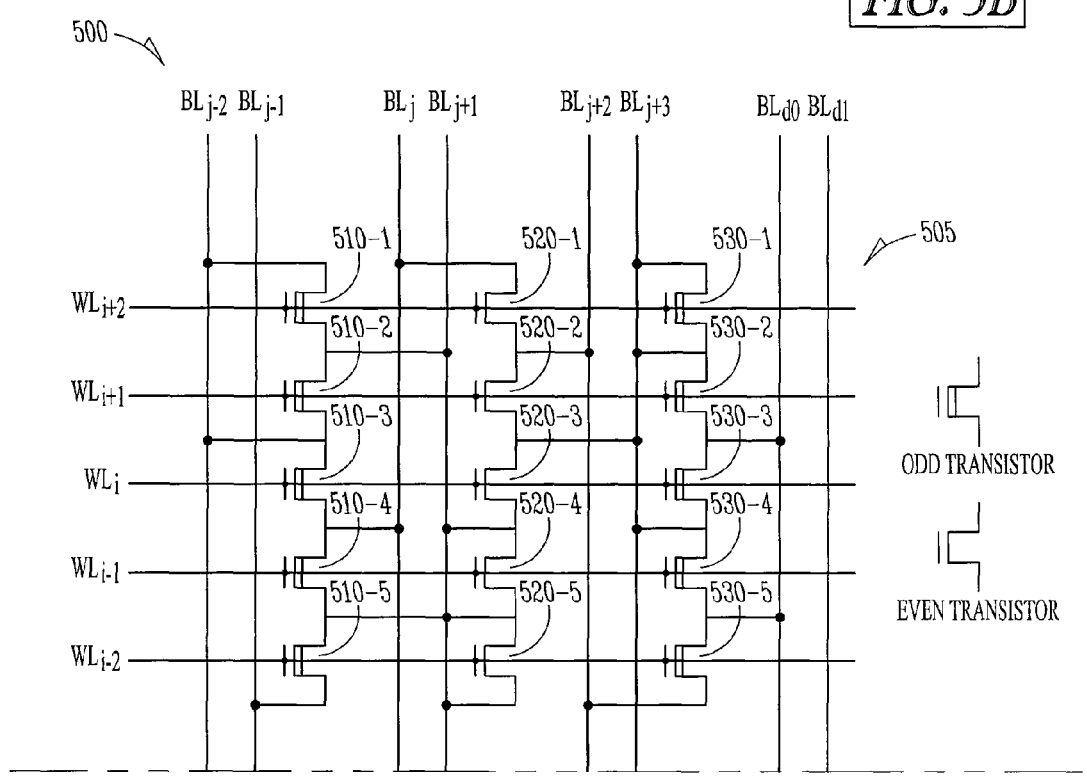
FIG. 5 presented as FIGS. 5A and 5B shows an example of current sense features for a ROM having a programmed memory array having shared bit-lines that may be used to read the data stored in ROM, according to the teachings of various embodiments.
Figure 5B:
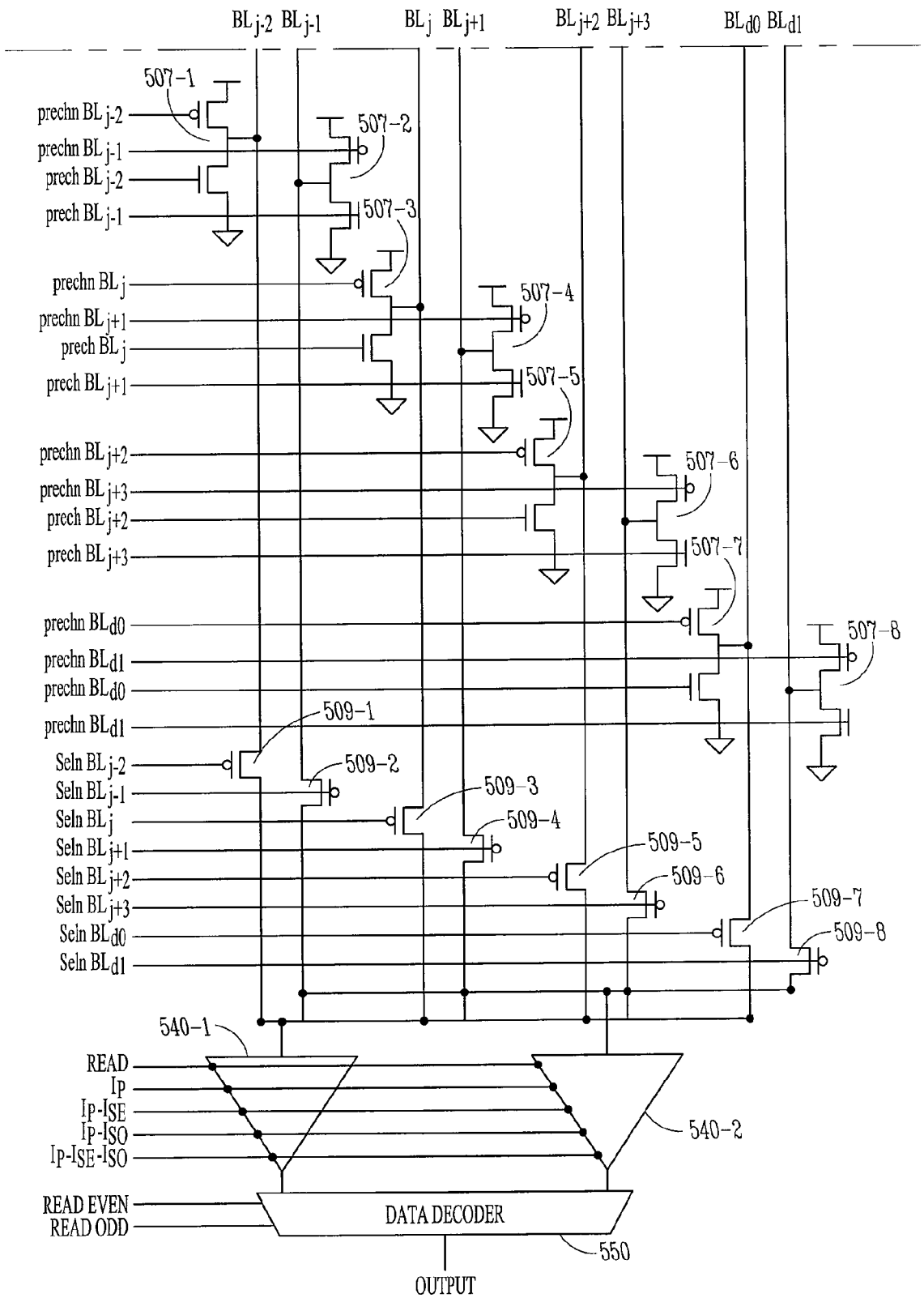

FIG. 5 presented as FIGS. 5A and 5B shows an example of current sense features for a ROM having a programmed memory array 505 having shared bit-lines that can be used to read the data stored in ROM 500, according to the teachings of various embodiments. To focus on these current sense features used in conjunction with ROM array 505 having shared bit-lines, FIG. 5 shows an example with five word-lines, each word-line coupled to one transistor in each of three columns. In this example, each transistor is configured as a bit-cell associated with two bit-lines and sharing two bit-lines with another bit-cell, which is adjacent on the right.

ROM array 505 includes bit-cells 510-1-510-5 in the first column on the left and bit-cells 530-1-530-5 in the column on the right, where between these columns is a column of bit-cells 520-1-520-5. None of the transistors in ROM array 505 are coupled to ground. The transistors 510-1-510-5 and 530-1-530-5 are designated with the same representation for these transistors, where the representation is referenced as an odd transistor, corresponding to the column number ($1^{st}$ column and $3^{rd}$ column). The transistors 520-1-520-5 are designated with a different symbol and referenced as an even transistor, corresponding to its column number ($2^{nd}$ column). The odd transistors are structured different from the even transistors so that current flow in an activated odd column is different from current flow in an activated even column. The different structures in adjacent columns are associated with the sharing of bit-lines by transistors along a common word-line. Since the even transistors are not adjacent with the other even transistors, the even transistors in ROM array 505 may be constructed with substantially the same structure. Similarly, for multiple odd columns, the odd transistors in these columns may be constructed with substantially the same structure. The even transistors may differ from odd transistors by their width, length, voltage threshold levels, $SV_{th}/HV_{th}$ ($SV_{th}$ means the standard threshold voltage and $HV_{th}$ means the high threshold voltage), and/or other features that affect the on-resistance of the transistors or other factors that affect the current flow through the transistors.

Each bit-line, $BL_{j-2}$, $BL_{j-1}$, $BL_j$, $BL_{j+1}$, $BL_{j+2}$, $BL_{j+3}$, $BL_{d0}$, and $BL_{d1}$, is coupled to precharge structures 507-1-507-8, respectively. $BL_{d0}$, and $BL_{d1}$ are added bit-lines to store and read the data from the last bit-cell on each word-line. Each precharge structure is constructed as a two transistor in series between an effective supply voltage and another reference voltage such as ground and is arranged to receive a precharge enable signal prechn $BL_x$. $BL_x$ corresponds to the bit-line associated with the respective one precharge structure 507-1 . . . or 507-8.

Each bit-line, $BL_{j-2}$, $BL_{j-1}$, $B_j$, $BL_{j+1}$, $BL_{j+2}$, $BL_{j+3}$, $BL_{d0}$, and $BL_{d1}$, is coupled to select structures 509-1-509-8, respectively. Select structures 509-1-509-8 allow current to flow from connected bit-lines to current comparators 540-1 and 540-2. Comparators 540-1 and 540-2 are arranged to operatively receive a read signal and one or more reference current signals.

These reference current signals may include a reference current signal, $I_p$, of the saturation current of a PMOS (p-channel metal oxide semiconductor) transistor in a precharge unit 507, reference current difference $I_p-I_{se}$, where $I_{se}$ is the saturation current of an even transistor, reference current difference $I_p-I_{so}$, where $I_{so}$ is the saturation current of an odd transistor, and reference current difference $I_p-I_{se}-I_{so}$. Comparators 540-1 and 540-2 operatively provide results to a data decoder 550 that is configured to operatively receive a read even signal and a read odd signal to determine whether to select an input correlated to an odd column or an input correlated to an even column. In various embodiments, data decoder 550 is configured to perform a logic AND, (•), on values provided to it.

FIG. 5 and the above discussion is a non-limiting example of features that an embodiment of a ROM with an array having shared bit-lines may include to read data from the array of the ROM. The number of the various components shown in FIG. 5 will change in various embodiments having different number of shared bit-lines and word-lines. Other sensing techniques may be included in ROM architectures having arrays with shared bit-lines to store data.

Programming

Programming of a ROM memory array with shared bit-lines may be performed in the processing of the ROM. A wafer for forming the ROM may be provided with a plurality of transistors for the bit-cells of the memory array and an array of bit-lines in which the transistors are effectively arranged in rows and columns within the array of bit-lines with the bit-lines and transistors arranged according to the selected basic bit-cell structure. Connection of the bit-lines to the transistor of its bit-cell in a shared arrangement is made in accordance with the data bits to be stored by each bit-line in its shared arrangement. With a set of known data to be stored in the ROM, the respective connections of bit-lines to bit-cells can be made.

Connections to bit-cells may be realized as connections to the transistors of the bit-cells. These connections provide the storage of data in the bit-lines of the ROM. Programming the bit-cells by making the appropriate connections of bit-cells to bit-lines may be accomplished using various techniques such as, but not limited to, diffusion of material to form a desired electrical relationship between each transistor and appropriate bit-lines or forming metal connections between a transistor and appropriate bit-lines to form the desired electrical relationship. Techniques that use making metal connections may be implemented by using various metal masks correlated to the programming desired. Each technique is applied in accordance with the data to be stored in the read only memory.

Figure 6A:
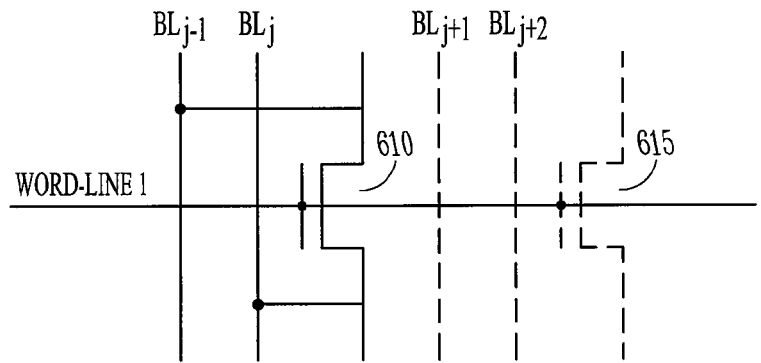
FIGS. 6A-6P show examples of possible programming connections with respect to a bit-cell associated with two bit-lines and sharing bit-lines with an adjacent bit-cell, according to the teachings of various embodiments.
Figure 6B:
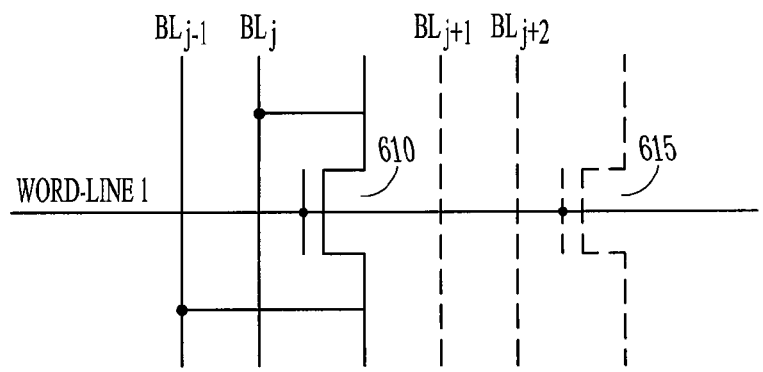
Figure 6C:
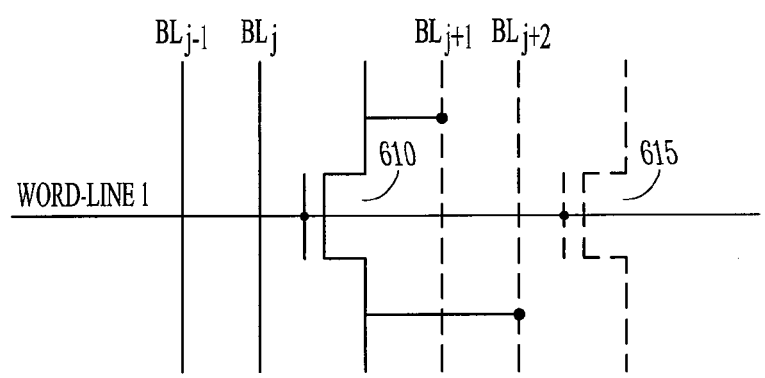
Figure 6D:
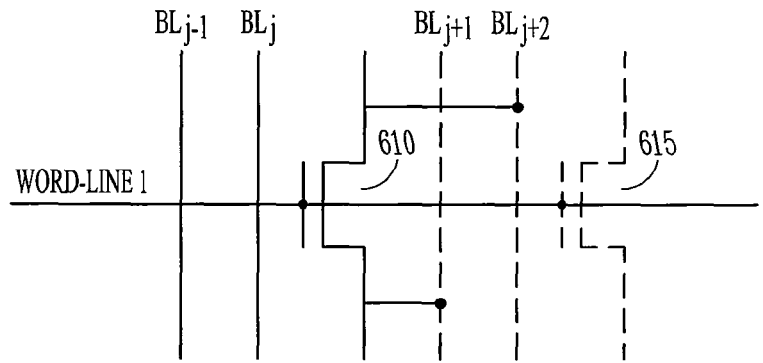
Figure 6E:
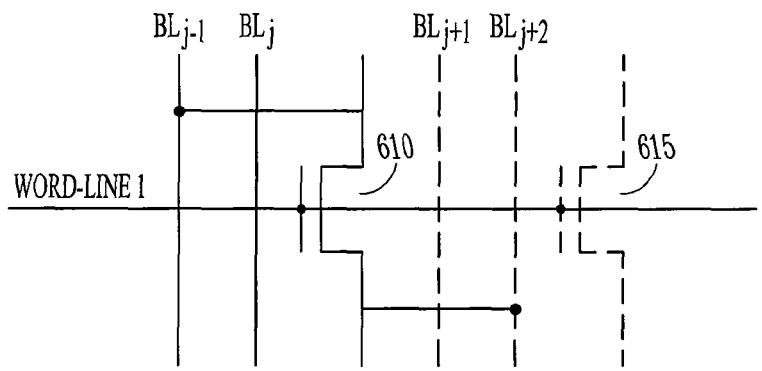
Figure 6F:
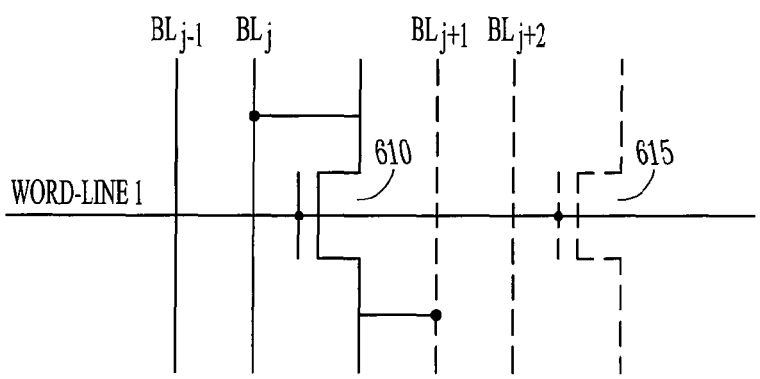
Figure 6G:
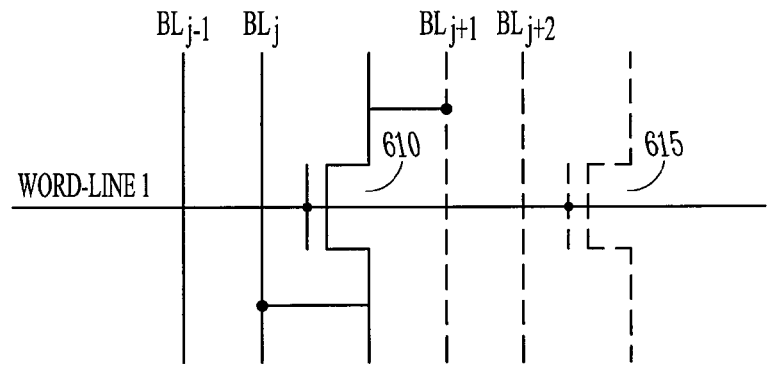
Figure 6H:
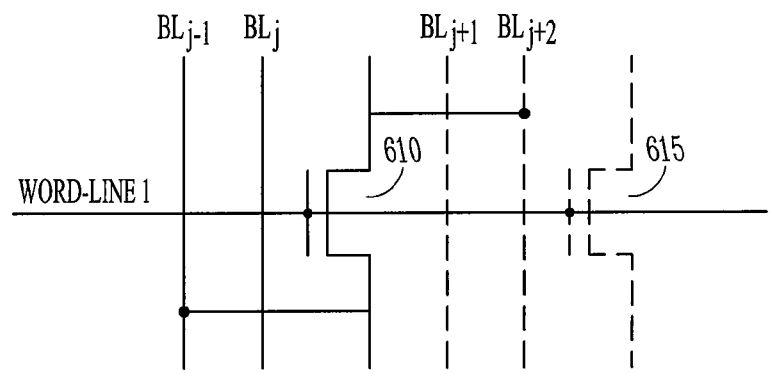
Figure 6I:
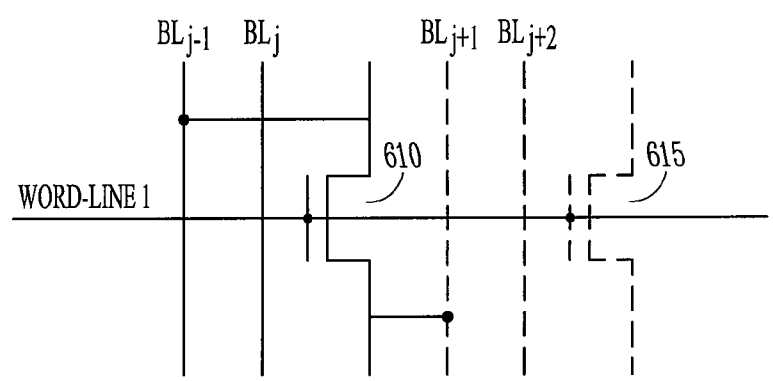
Figure 6J:
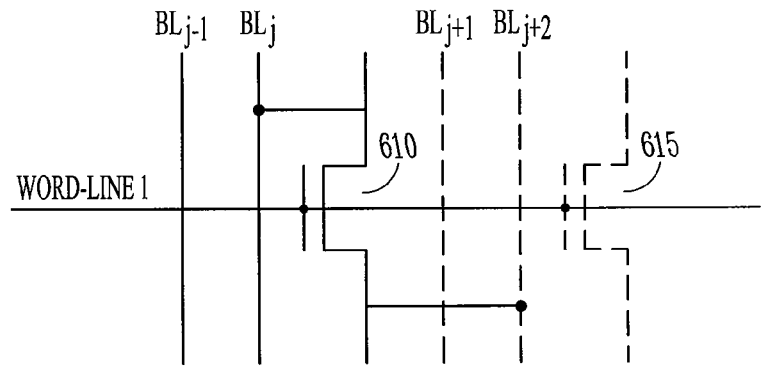
Figure 6K:
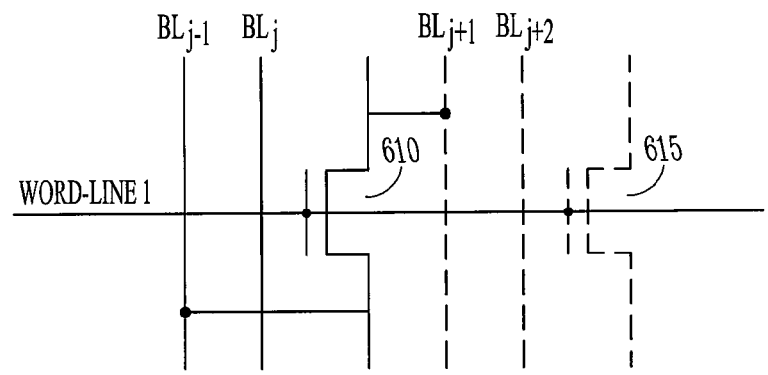
Figure 6L:
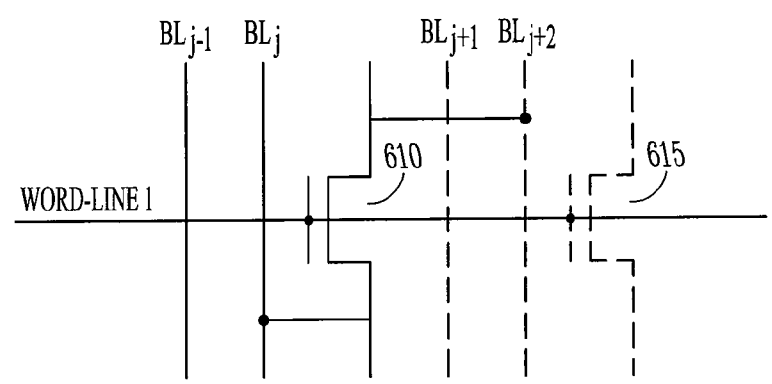
Figure 6M:
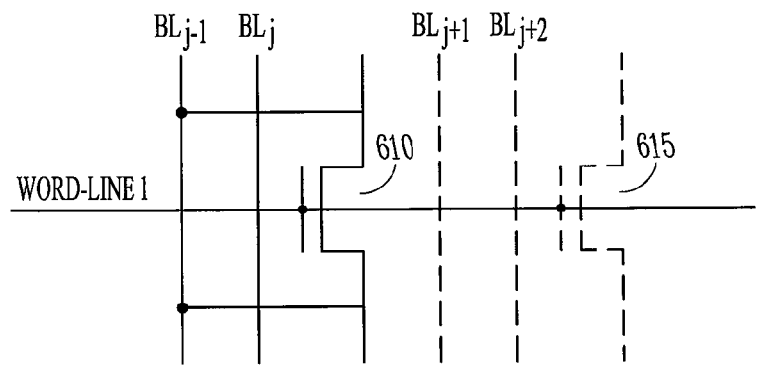
Figure 6N:
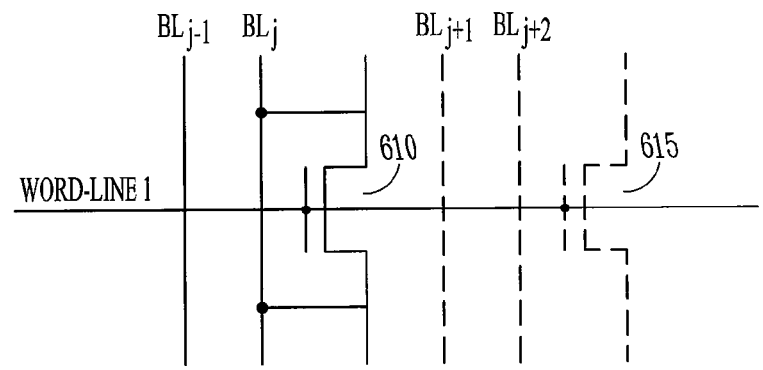
Figure 6O:
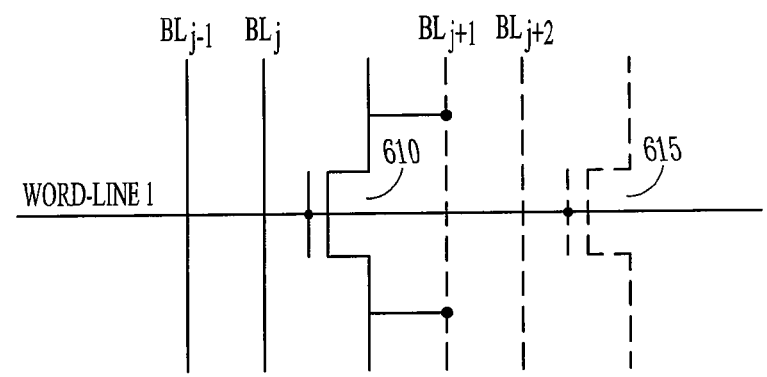
Figure 6P:
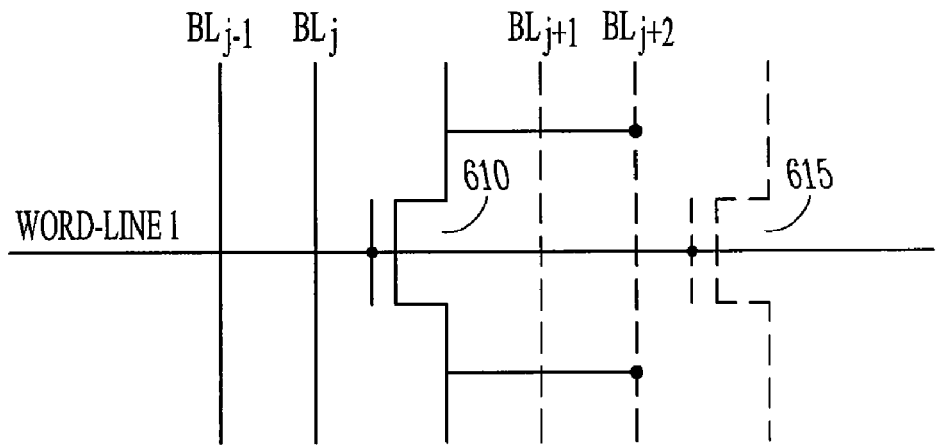

As an example embodiment of programming a ROM array in which the shared arrangements are based on two bit-lines associated with a transistor, such as depicted in FIGS. 2A and 3A, consider the following examples of programming such a ROM memory array. FIGS. 6A-6P show embodiments of possible programming connections with respect to a bit-cell associated with two bit-lines and sharing bit-lines with an adjacent bit-cell. In the example embodiments demonstrated in FIGS. 6A-6P, the associated bit-lines of each bit-cell 610 and 615 are located on the left side of bit-cells 610 and 615, respectively. To program "00," the bit-cell is connected to the two different bit-lines on the left or the right side of the bit-cell. The drain and source of a transistor (bit-cell) 610 are connected to the two different bit-lines on the left or the right side of bit-cell 610 as shown in FIGS. 6A-6D. To program "11" the drain and source of transistor 610 are both connected to the same bit-line, either its associated bit-lines or the associated bit-lines of transistor 615, as shown in FIGS. 6M-6P.

To program "01," the bit-cell is connected between the first bit-line on the left side of the bit-cell and the second bit-line on the right side of the bit-cell or the second bit-line on the left side of the bit-cell and to the first bit-line on the right side of the bit-cell. One of the drain or source of transistor 610 is connected to an associated bit-line on the left side of transistor 610 and the other of the drain or source of transistor 610 is connected to an associated bit-line of the adjacent bit-cell 615 on the right side of transistor 610 such that the connected bit-lines are in non-corresponding locations relative to the bit-cell to which they are assigned in the basic structure selected for this example, as shown in FIGS. 6E-6H. To program "10," the bit-cell is connected between the first bit-line on the left side of the bit-cell and to the first bit-line on the right side of the bit-cell, or to the second bit-line on the left side of the bit-cell and to the second bit-line on the right side of the bit-cell. One of the drain or source of transistor 610 is connected to an associated bit-line on the left side of transistor 610 and the other of the drain or source of transistor 610 is connected to an associated bit-line of the adjacent bit-cell 615 on the right side of transistor 610 such that the connected bit-lines are in corresponding locations relative to the bit-cell to which they are assigned in the basic structure selected for this example, as shown in FIGS. 6I-6L.

There are various possible connections of bit-lines to a bit-cell transistor to program a particular two-bit value. With "C" representing one connection of the bit-line to the drain or the source of the transistor and "2C" representing a connection of the bit-line to the drain and to the source of the transistor, Table 1 illustrates possible programming configurations (shown vertically) for programming 00, 01, 10, and 11 using two bit-lines per bit-cell, as shown in FIGS. 6A-6P. The ROM is arranged with reading bit-lines and select bit-lines that may be chosen before programming the bit-cells. When reading on an associated target bit-line, the other associated bit-line is a selected bit-line that is not used as a reading bit-line. In the programming possibilities given in Table 1, the target reading bit-lines are the target bit-line to be read ($BL_{j-1}$ or $BL_j$) and the first adjacent bit-line on the right side of the bit-cell ($BL_{j+1}$). For n=2, it is possible to detect the reading bit-lines with respect to the programming chosen. The programming of 01 (or 10) gives the location of the adjacent reading bit-line. In the programming of Table 1, the associated bit-lines are $BL_{j-1}$ and $BL_j$ and the adjacent associated bit-lines are $BL_{j+1}$ and $BL_{j+2}$. One possible connection of the bit-cell when programming 01 is between $BL_{j-1}$ (associated bit-line) and $BL_{j+2}$ (associated adjacent bit-line). Thus, with $BL_{j+2}$ set to "0" for reading, then $BL_{j+2}$ is a selected bit-line, and $BL_{j+1}$ is the adjacent reading bit-line.

TABLE 1

| Stored data on $BL_{j-1}BL_j$ | 00 Possibilities | 01 Possibilities | 10 Possibilities | 11 Possibilities |
|---|---|---|---|---|
| $BL_{j-1}$ | C | C | C | 2C |
| $BL_j$ | C | C | C | 2C |
| $BL_{j+1}$ | C | C | C | 2C |
| $BL_{j+2}$ | C | C | C | 2C |

With C and 2C nomenclature used as in Table 1, Table 2 demonstrates another example of possible connections to program 00, 01, 10, and 11 using two bit-lines per bit-cell. In the programming possibilities given in Table 2, the target reading bit-lines are the target bit-line to be read ($BL_{j-1}$ or $BL_j$) and the second adjacent bit-line on the right side of the bit-cell ($BL_{j+2}$). In the programming of Table 2, the associated bit-lines are $BL_{j-1}$ and $BL_j$ and the adjacent associated bit-lines are $BL_{j+1}$ and $BL_{j+2}$. The connection of the bit-cell when programming 01 is between $BL_{j-1}$ (associated bit-line) and $BL_{j+1}$ (associated adjacent bit-line). One possible connection of the bit-cell when programming 10 is between $BL_{j-1}$ (associated bit-line) and $BL_{j+2}$ (associated adjacent bit-line). $BL_{j+2}$ is the adjacent reading bit-line and will not be set to 0 for reading.

TABLE 2

| Stored data on BL_{j-1}, BL_j | 00 Possibilities | 01 Possibilities | 10 Possibilities | 11 Possibilities |
|---|---|---|---|---|
| BL_{j-1} | C |   | C | 2C |
| BL_j | C | C | C | 2C |
| BL_{j+1} |   | C | C | 2C |
| BL_{j+2} |   | C | C | 2C |

According to Table 2, the connections of 01 in Table 1 can be used for 10 in Table 2 with the connections of 10 in Table 1 used for 01 in Table 2. To program "00," the bit-cell is connected between the two different bit-lines on the left or the right side of the bit-cell. The drain and source of a transistor (bit-cell) 610 are connected to the two different bit-lines on the left or the right side of bit-cell 610 as shown in FIGS. 6A-6D. To program "11" the drain and source of transistor 610 are both connected to the same bit-line, either its associated bit-lines or the associated bit-lines of transistor 615, as shown in FIGS. 6M-6P.

To program "10," the bit-cell is connected between the first bit-line on the left side of the bit-cell and to the second bit-line on the right side of the bit-cell, or the second bit-line on the left side of the bit-cell and to the first bit-line on the right side of the bit-cell. One of the drain or source of transistor 610 is connected to an associated bit-line on the left side of transistor 610 and the other of the drain or source of transistor 610 is connected to an associated bit-line of the adjacent bit-cell 615 on the right side of transistor 610 such that the connected bit-lines are in non-corresponding locations relative to the bit-cell to which they are assigned in the basic structure selected for this example, as shown in FIGS. 6E-6H. To program "01," the bit-cell is connected between the first bit-line on the left side of the bit-cell and the first bit-line on the right side of the bit-cell, or to the second bit-line on the left side of the bit-cell and to the second bit-line on the right side of the bit-cell. One of the drain or source of transistor 610 is connected to an associated bit-line on the left side of transistor 610 and the other of the drain or source of transistor 610 is connected to an associated bit-line of the adjacent bit-cell 615 on the right side of transistor 610 such that the connected bit-lines are in corresponding locations relative to the bit-cell to which they are assigned in the basic structure selected for this example, as shown in FIGS. 6I-6L.

In various embodiments, a programming principle may be applied in a similar manner for the different locations of the bit-lines and the different number of bit-lines per bit-cell. In programming, it is the connection of the bit-lines to the transistor of the bit-cell that changes depending on the contents and the location of the bit-lines. Tables 3A and 3B demonstrate possible configurations (read vertically) to program the eight data ('000' '001' '010' '011' '100' '101' '110' '111') values on $BL_{j-2}\,BL_{j-1}\,BL_j$ (n=3) associated with bit-cell 410 of FIG. 4B.

TABLE 3A

| Store data on $BL_{j-2}\,BL_{j-1}\,BL_j$ | 000 Possibilities | 001 Possibilities | 010 Possibilities | 011 Possibilities |
|---|---|---|---|---|
| $BL_{j-2}$ | C | C | C | C |
| $BL_{j-1}$ | C | C | C | C |
| $BL_j$ | C | C | C | C |
| $DL_j$ | C | C | C | C |
| $BL_{j+1}$ | C | C | C | C |
| $BL_{j+2}$ | C | C | C | C |
| $BL_{j+3}$ | C | C | C | C |
| $DL_{j+1}$ | C | C | C | C |

TABLE 3B

| Store data on $BL_{j-2}\,BL_{j-1}\,BL_j$ | 100 Possibilities | 101 Possibilities | 110 Possibilities | 111 Possibilities |
|---|---|---|---|---|
| $BL_{j-2}$ | C | C | C | 2C |
| $BL_{j-1}$ | C | C | C | 2C |
| $BL_j$ | C | C | C | 2C |
| $DL_j$ | C | C | C | 2C |
| $BL_{j+1}$ | C | C | C | 2C |
| $BL_{j+2}$ | C | C C | 2C |  |
| $BL_{j+3}$ | C C | C | 2C |  |
| $DL_{j+1}$ | C | C | C | 2C |

In various embodiments, programming a ROM array with shared n bit-lines, including $n \geq 1$, the transistor of each bit-cell can be connected to the same bit-line or to 2 different bit-lines. The different bit-lines could be set on the same side of the bit-cell or in the opposite side of the bit-cell. The reading on each target bit-line is made through $2^{n-1}$ reading bit-lines including the target bit-line. In various embodiments, for any value of n, the n bit-lines associated with each bit-cell arranged in any of the various locations for these bit-lines, a general principle may used to program the ROM. To program a "1," the drain (or the source) of the target transistor is connected to any target reading bit-line and the source (or the drain) of the target transistor is connected to another or to the same target reading bit-line. In another embodiment, to program a "1," neither the source nor the drain of the target transistor is connected to any target reading bit-line. In another embodiment, both the drain and the source are connected to the same bit-line attached to the target transistor. To program a "0," the drain (or the source) of the target transistor is connected to any target read bit-line and the source or the drain is connected to any not reading bit-line attached to the target transistor.

Reading

In various embodiments, reading a ROM array with shared bit-lines may be conducted by reading a number of bit-lines including a target bit-line. The reading on each target bit-line is made through $2^{n-1}$ reading bit-lines that include the target bit-line. There are a number of ways to read the data. In an embodiment, reading may be realized using current comparators as sense amplifiers. In the following examples, reading is demonstrated for a bit-line with this target bit-line on the left side of the bit-cell. In the example below for reading a ROM array having two (n=2) shared bit-lines, the locations of bit-lines are the ones shown in FIG. 3A and Table 1. In the example below for reading a ROM array having three (n=3) shared bit-lines, the locations of the bit-lines are the ones shown in FIG. 4B and Tables 3A and 3B.

In various embodiments, for a ROM array with shared bit-lines with n=2, each bit-cell is attached to its associated two bit-lines and the two adjacent bit-lines. There are two target reading bit-lines for each target bit-line (the target bit-line associated with a bit-cell and one bit-line associated with an adjacent bit-cell) and two target selected bit-lines (the remaining two bit-lines). To read the contents of the target bit-cell through one target bit-line, the reading is made on the two target reading bit-lines on the same read cycle. The reading made on the two target reading bit-lines may be compared to extract the value of the data stored on the target bit-line. In an embodiment, the comparison may include a logic operation on the two read values. The logic operation may be an AND operation.

When the ROM is in stand-by mode, all the bit-lines in the ROM array are in a high impedance state. Initiation of a read operation may be generated by a controller coupled to the ROM. When the read operation is activated in the ROM, all the target bit-lines to be read (reading bit-lines) are set to a reference voltage, which may be a source voltage such as $V_{dd}$ that is substantially constant. With no ground line in the ROM data storage array, the target selected bit-lines may be set to a voltage level corresponding to a "0." With the reading conducted with current comparators, the setting of these bit-lines may be maintained during the complete read operation. The target word-line and corresponding sense amplifiers are activated. Once, the corresponding sense amplifiers read the data, the corresponding sense amplifiers and the target word-line are deactivated. The reading operation may be ended when all the bit-lines are set back to the stand-by mode, which may include all the bit-lines set back to a high impedance state.

Considering the programming example given in Table 1, identification of the locations of the target reading and selected bit-lines for each target bit-line for this example is given in the Table 4 below, where the symbol · between bit-lines indicates a logic AND operation:

TABLE 4

|  | $BL_{j-1}$ | $BL_j$ | $BL_{j+1}$ | $BL_{j+2}$ | Reading on reading bit-lines |
|---|---|---|---|---|---|
| Read On $BL_{j-1}$ | Reading bit-line | Selected bit-line | Reading bit-line | Selected bit-line | $BL_{j-1} \cdot BL_{j+1}$ |
| Read on $BL_j$ | Selected bit-line | Reading bit-line | Reading bit-line | Selected bit-line | $BL_j \cdot BL_{j+1}$ |

Table 5 shows the setting of the bit-lines voltages according to the bit-lines of Table 4, where HZ means high impedance state.

TABLE 5

|  |  | $BL_{j-1}$ | $BL_j$ | $BL_{j+1}$ | $BL_{j+2}$ | Other Bit-lines | Current reading on reading bit-lines |
|---|---|---|---|---|---|---|---|
|  | Stand By | HZ | HZ | HZ | HZ | HZ |  |
| Read On $BL_{j-1}$ | Pre-charge | $V_{dd}$ | 0 | $V_{dd}$ | 0 | HZ |  |
|  | Read | $V_{dd}$ | 0 | $V_{dd}$ | 0 | HZ | $BLj-1 \cdot BLj+1$ |
| Read on $BL_j$ | Pre-charge | 0 | $V_{dd}$ | $V_{dd}$ | 0 | HZ |  |
|  | Read | 0 | $V_{dd}$ | $V_{dd}$ | 0 | HZ | $BLj \cdot BLj+1$ |

Figure 7:
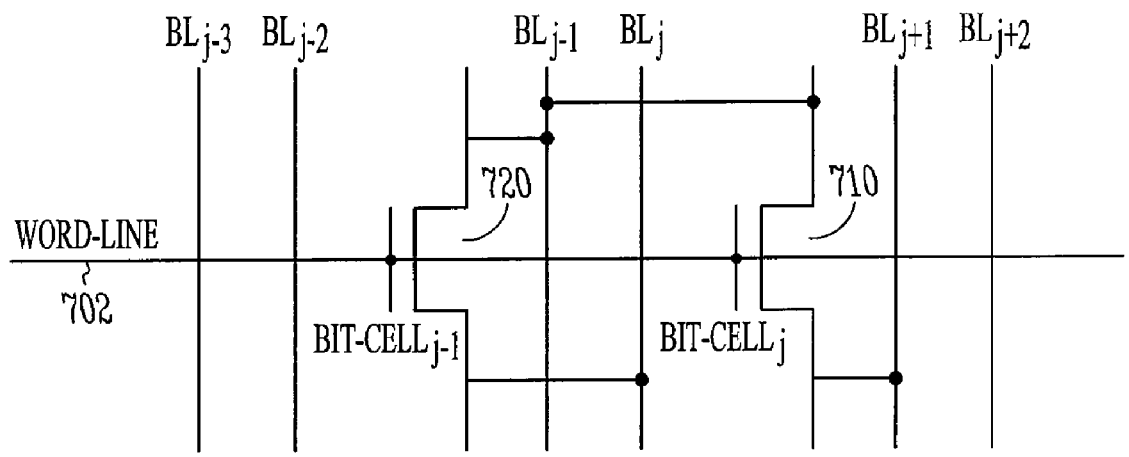
FIG. 7 shows an example of connections programmed for n=2 bit-lines, according to the teachings of various embodiments.

FIG. 7 shows an example of connections programmed for n=2 bit-lines, according to various embodiments. These are shown relative to FIG. 3A and Table 1 for the example in Tables 5 and 6. For each location of the bit-lines in the corresponding ROM array, the bit-lines are shared between two bit-cells. As demonstrated in FIG. 7, each bit-line could be connected to only one bit-cell or to two bit-cells as shown for $BL_{j-1}$. The arrangement of connections to the ROM is known when the connections are selected to program data in the ROM array. The sense amplifier is configured with knowledge as to how the bit-line is connected and to which bit-cell the bit-line is connected, when reading on the data on a bit-line. A controller or processor configured to access the data stored in the ROM may control the reading of data from the ROM.

Table 6 shows an example of the contents of the bit-lines as programmed in FIG. 7. Bit-cell j includes transistor 710 with associated bit-lines $BL_{j-1}$ and $BL_j$ and sharing bit-lines $BL_{j+1}$ and $BL_{j+2}$. Bit-cell j−1 includes transistor 720 with associated bit-lines $BL_{j-3}$ and $BL_{j-2}$ and sharing bit-lines $BL_{j-1}$ and $BL_j$. Transistors 710 and 720 are both coupled to word-line 702 such that word-line 702 can activate bit-cell j and bit-cell j−1. Using an arrangement as shown in example embodiment of FIG. 5, the data associated with bit-cell j−1 and bit-cell j can be read.

TABLE 6

| Bit-Cell j − 1 | | Bit-Cell j | |
|---|---|---|---|
| $BL_{j-3}$ | $BL_{j-2}$ | $BL_{j-1}$ | $BL_j$ |
| 0 | 0 | 1 | 0 |

With transistors 710 and 720 coupled to word-line that is activated, transistors 710 and 720 conduct current since the drains and sources of these transistors are coupled to bit-lines that are either set to $V_{dd}$ or a "0" reference according to Tables 5 and 6 for this example. Since a bit-line such as $BL_{j-1}$ can be coupled to two transistors 710 and 720 that are adjacent to each other along a word-line, two adjacent bit-cells (transistors) along a word-line the ROM array are structured differently. As discussed with respect to FIG. 5, two adjacent bit-cells along a word-line may be referred to as even and odd bit-cells or even and odd transistors. Then, the even and odd bit-cells (transistors) in the ROM array with shared bit-lines have different characteristics. All the even bit-cells (transistors) may be substantially the same in structure and all the odd bit-cells (transistors) may be substantially the same in structure.

FIG. 5 depicts an example ROM memory array with the contents of Table 7 and the programming of Table 1. The contents of Table 7 are an example of data bits that can be stored on each bit-line. Given a set of data bits stored on bit-lines, various connections can be made in architectures having n bit-lines per bit-cell. In FIG. 5, $BL_{d0}$ and $BL_{d1}$ are added bit-lines used to store and read the data from the last bit-cell on each word-line.

TABLE 7

| Contents | Blj − 2 | Blj − 1 | Blj | Blj + 1 | Blj + 2 | Blj + 3 |
|---|---|---|---|---|---|---|
| $WL_{i+2}$ | 0 | 1 | 1 | 0 | 1 | 1 |
| $WL_{i+1}$ | 0 | 1 | 0 | 0 | 0 | 1 |
| $WL_i$ | 1 | 0 | 1 | 0 | 0 | 1 |
| $WL_{i-1}$ | 0 | 0 | 1 | 1 | 0 | 1 |
| $WL_{i-2}$ | 1 | 0 | 1 | 1 | 1 | 0 |

In an embodiment in which current comparators are used to read the data stored in each bit-cell, one or more current references are generated to which the current of the bit-line can be compared. To read the data with all the possible connection of the bit-lines, four or more or less different currents may be used depending on the architectures. The different currents may be generated according to characteristic currents of a device in the read structure of the ROM and/or one or more different transistors in the ROM array. These reference current signals may include a reference current signal, $I_p$, of the current saturation of a PMOS in a precharge unit 507 of FIG. 5, reference current difference $I_p-I_{se}$, where $I_{se}$ is the current saturation of an even transistor, reference current difference $I_p-I_{so}$, where $I_{so}$ is the current saturation of an odd transistor, and reference current difference $I_p-I_{se}-I_{so}$. Table 8 shows the possible value of the current on the bit-lines in relation to the connection of the bit-lines to the drain and/or the source of even and odd transistors in the ROM memory array. For each location of the bit-lines and the number of associated bit-lines per bit-cell, the reading on the current comparators may be conducted as demonstrated in Table 8.

TABLE 8

| Drain of odd transistor connected to | Source of odd transistor connected to | Drain of even transistor connected to | Source of even transistor connected to | Current on the connected target reading bit-line | Read on odd cell | Read on even cell |
|---|---|---|---|---|---|---|
| Any target reading bit-line | Any target reading bit-line | | | $I_p$ | 1 | 1 |
| | | Any target reading bit-line | Any target reading bit-line | $I_p$ | 1 | 1 |
| Any target selected bit-line | Any target selected bit-line | | | $I_p$ | 1 | 1 |
| | | Any target selected bit-line | Any target selected bit-line | $I_p$ | 1 | 1 |
| Any target reading bit-line | Any target selected bit-line | | | $I_p - I_{so}$ | 0 | 1 |
| | | Any target reading bit-line | Any target selected bit-line | $I_p - I_{se}$ | 1 | 0 |

TABLE 8-continued

| Drain of odd transistor connected to | Source of odd transistor connected to | Drain of even transistor connected to | Source of even transistor connected to | Current on the connected target reading bit-line | Read on odd cell | Read on even cell |
|---|---|---|---|---|---|---|
| Any target selected bit-line | Any target reading bit-line | | | $I_p - I_{so}$ | 0 | 1 |
| | | Any target selected bit-line | Any target reading bit-line | $I_p - I_{se}$ | 1 | 0 |
| Any target reading bit-line | Any target selected bit-line | Same target reading bit-line | Any target selected bit-line | $I_p - I_{so} - I_{se}$ | 0 | 0 |
| Any target selected bit-line | Any target reading bit-line | Any target selected bit-line | Any target reading bit-line | $I_p - I_{so} - I_{se}$ | 0 | 0 |

Consider the following read example to read "0" on bit-line $BL_{j+1}$ for word-line $WL_i$ using the example architecture of FIG. 5, where $BL_{j+1}$ and $BL_j$ are the bit-lines associated with even transistor bit-cell 520-3 coupled to $WL_i$. Reading bit-lines are $BL_{j+1}$ and $BL_{j+2}$ and select bit-lines are $BL_j$ and $BL_{j+3}$. To begin the read, the reading bit-lines are set to and kept at $V_{dd}$, while the selected bit-lines are set to "0" during the complete read operation. Target word-line $WL_i$ may be activated along with the activation of the corresponding sense-amplifiers. The sense amplifier associated with $BL_{j+1}$ determines the current value for $BL_{j+1}$ to be Ip–$I_{se}$, which reads '0' as being on $BL_{j+1}$. The sense-amplifier associated with $BL_{j+2}$ determines the current for $BL_{j+2}$ to be Ip, which reads '1' as being on $BL_{j+2}$. Then the value read is logic operation $BL_{j+1} \cdot BL_{j+2}=0$. After reading bit-line $BL_{j+1}$ for word-line $WL_i$, word-line $WL_i$ and the corresponding sense amplifiers can be disabled. All the bit-lines can be set back to a high impedance state. With all the bit-lines back to a high impedance state, the read operation is ended.

Figure 8:
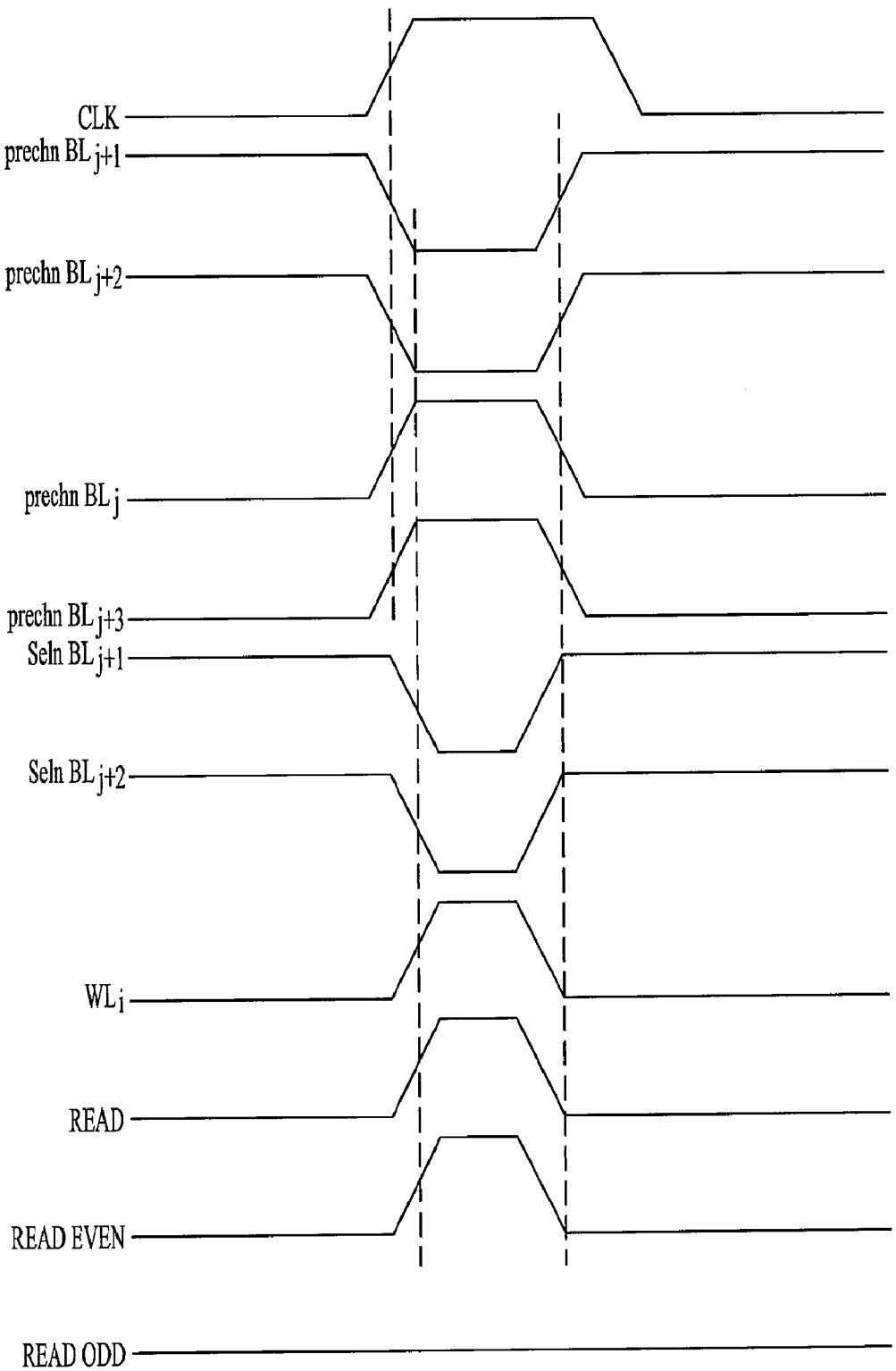
FIG. 8 illustrates timing waveforms for an example to read "0" on a bit-line associated with an even transistor bit-cell coupled to a word-line arranged as in the example architecture (n=2) of FIG. 5, according to the teachings of various embodiments.

FIG. 8 illustrates timing waveforms for the example to read "0" on bit-line $BL_{j+1}$ for word-line $WL_i$ using the example architecture (n=2) of FIG. 5, where $BL_{j+1}$ and $BL_j$ are the bit-lines associated with even transistor bit-cell 520-3 coupled to $WL_i$. As an example, precharge signal, prechn BLx, is active at a logic low and is active when the corresponding bit-line is a read bit-line and precharge signal, prech BLx, is active at a logic high and is active when the corresponding bit-line is a selected bit-line. A signal, Seln, is active at a logic low and is active when the corresponding bit-line is a read bit-line. The signals, read, read even, and read odd, are active at a logic high. The number of prechn, prech, and Seln signals depends on the number of words per word-line. The number of words per word-line also affects the configuration of column multiplexers used.

Consider the following read example to read "0" on bit-line $BL_{j-1}$ for word-line $WL_{i-2}$ using the example architecture of FIG. 5, where $BL_{j-2}$ and $BL_{j-1}$ are the bit-lines associated with odd transistor bit-cell 510-5 coupled to $WL_{i-2}$. Reading bit-lines are $BL_{j-1}$ and $BL_j$ and select bit-lines are $BL_{j-2}$ and $BL_{j+1}$. To begin the read, the reading bit-lines are set to and kept at $V_{dd}$, while the selected bit-lines are set to "0" during the whole read. Target word-line $WL_{i-2}$ may be activated along with the activation of the corresponding sense-amplifiers. The sense amplifier associated with $BL_{j-1}$ determines the current value for $BL_{j-1}$ to be Ip–$I_{so}$, which reads '0' as being on $BL_{j-1}$. The sense-amplifier associated with $BL_j$ determines the current for $BL_j$ to be $I_p$, which reads '1' as being on $B_j$. Then the value read is logic operation $BL_{j-1} \cdot BL_j=0$. After reading bit-line $BL_{j-1}$ for word-line $WL_{i-2}$, word-line $WL_{i-2}$ and the corresponding sense amplifiers can be disabled. All the bit-lines can be set back to a high impedance state. With all the bit-lines back to a high impedance state, the read operation is ended.

Consider the following read example to read "1" on bit-line $BL_{j+3}$ for word-line $WL_{i-1}$ using the example architecture of FIG. 5, where $BL_{j+2}$ and $BL_{j+3}$ are the bit-lines associated with odd transistor bit-cell 530-4 coupled to $WL_{i-1}$. Reading bit-lines are $BL_{j+3}$ and $BL_{d0}$ and select bit-lines are $BL_{j+2}$ and $BL_{d1}$. To begin the read, the reading bit-lines are set to and kept at $V_{dd}$, while the selected bit-lines are set to "0" during the whole read. Target word-line $WL_{i-1}$ may be activated along with the activation of the corresponding sense-amplifiers. The sense amplifier associated with $BL_{j+3}$ determines the current values for $BL_{j+3}$ and $BL_{d0}$ to be Ip, which reads '1' as being on $BL_{j+3}$ and on $BL_{d0}$. Then the value read is the logic operation $BL_{j+3} \cdot BL_{d0}=1$. After reading bit-line $BL_{j+3}$ for word-line $WL_{i-1}$, word-line $WL_{i-1}$ and the corresponding sense amplifiers can be disabled. All the bit-lines can be set back to a high impedance state. With all the bit-lines back to a high impedance state, the read operation is ended.

Consider the following read example to read "1" on bit-line $BL_{j+1}$ for word-line $WL_{i-1}$ using the example architecture of FIG. 5, where $BL_j$ and $BL_{j+1}$ are the bit-lines associated with even transistor bit-cell 530-4 coupled to $WL_{i-1}$. Reading bit-lines are $BL_{j+1}$ and $BL_{j+2}$ and select bit-lines are $BL_j$ and $BL_{j+3}$. To begin the read, the reading bit-lines are set to and kept at $V_{dd}$, while the selected bit-lines are set to "0" during the complete read operation. Target word-line $WL_{i-1}$ may be activated along with the activation of the corresponding sense-amplifiers. The sense amplifier associated with $BL_{j+1}$ determines the current value for $BL_{j+1}$ is $I_p$–$I_{so}$, which reads '1' as being on $BL_{j+1}$. The sense amplifier associated with $BL_{j+2}$ determines the current value for $BL_{j+2}$ is $I_p$, which reads '1' as being on $BL_{j+2}$. Then the value read is $BL_{j+1} \cdot BL_{j+2}=1$. After reading bit-line $BL_{j+1}$ for word-line $WL_{i-1}$, word-line $WL_{i-1}$ and the corresponding sense amplifiers can be disabled. All the bit-lines can be set back to a high impedance state. With all the bit-lines back to a high impedance state, the read operation is ended.

In various embodiments, a ROM architecture may include shared bit-lines in which a bit-cell is associated with one bit-line and shares another bit-line, which corresponds to a n=1 arrangement with no added bit-lines (i.e., l=0) and one bit stored in each bit-cell. As with n≧2, the programming includes connecting bit-lines to transistors arranged in columns as even and odd transistors. The one bit stored in each bit-cell may be read using only one reading bit-line that is the target bit-line to be read for each target bit-cell. The reading operation may be conducted as described in table 8.

In various embodiments for a ROM array having n=3 shared bit-lines, each bit-cell is attached to its associated three bit-lines, three adjacent bit-lines, and two added bit-lines. To perform read operations, there are four target reading bit-lines for each target bit-line (the target bit-line, two adjacent bit-lines and one added bit-lines) and four target selected bit-lines (the remaining four bit-lines). Reading the contents of a target bit-cell through one target bit-line may be performed on the four target reading bit-lines on the same read cycle. In an embodiment, reading procedures of a ROM array with shared bit-lines for n=3 may be performed in substantially the same as the procedures described in the above examples for n=2. As with the case for an n=2 architecture, an n=3 architectures may include a ROM memory array structure in which two adjacent transistors bit-cells along a common word-line are different. For each location of the bit-lines and the number of associated bit-lines per bit-cell, reading on the current comparators may be conducted as described in Table 8.

Table 9 shows the location of reading bit-lines and select bit-lines for the examples of programming given on Tables 3A and 3B. The target reading and selected bit-lines for each target bit-line is given in Table 9.

For a ROM array with shared bit-lines, $n \geq 1$, a configuration includes each bit-cell attached to its associated n bit-lines, n adjacent bit-lines, and $2^n-2*n$ added bit-lines. There are $2^{n-1}$ target reading bit-lines for each target bit-line (the target bit-line, n−1 adjacent bit-lines, and $2^{n-1}$-n added bit-lines) and $2^{n-1}$ target selected bit-lines (the remaining $2^{n-1}$ bit-lines). Reading the contents of one bit-line associated to one bit-cell is made on the $2^{n-1}$ target reading bit-lines on the same read cycle. For each bit-line at whatever location of the bit-line in the ROM array and the number of the associated bit-lines in each bit-cell, reading on the current comparators is conducted as described in Table 8.

When the ROM memory is in stand-by mode, all the bit-lines are in a high impedance state. When the read operation is activated in the ROM memory, all the target bit-lines to be read (reading bit-lines) are set to $V_{dd}$. As there is no ground line in the whole memory array, the target selected bit-lines are set to a "0" value. With the reading performed with a current comparator, the setting of the bit-lines is kept during the whole read operation. The target word-line and corre-

TABLE 9

|  | $BLj-2$ | $BLj-1$ | $BLj$ | $DLj$ | $BLj+1$ | $BLj+2$ | $BLj+3$ | $DLj+1$ | Reading on reading big-lines |
|---|---|---|---|---|---|---|---|---|---|
| Read on $BLj-2$ | Reading bit-line | Selected bit-line | Selected bit-line | Selected bit-line | Selected bit-line | Reading bit-line | Reading bit-line | Reading bit-line | $BLj-2 \cdot BLj+2 \cdot BLj+3 \cdot DLj+1$ |
| Read on $BLj-1$ | Selected bit-line | Reading bit-line | Selected bit-line | Selected bit-line | Reading bit-line | Selected bit-line | Reading bit-line | Reading bit-line | $BLj-1 \cdot BLj+1 \cdot BLj+3 \cdot DLj+1$ |
| Read on $BLj$ | Selected bit-line | Selected bit-line | Reading bit-line | Selected bit-line | Reading bit-line | Reading bit-line | Selected bit-line | Reading bit-line | $BLj \cdot BLj+1 \cdot BLj+2 \cdot DLj+1$ |

Table 10 shows the setting of the bit-lines voltages according to the location of bit-lines in Table 9.

sponding sense amplifiers are activated. Once, the corresponding sense amplifiers read the data, the corresponding

TABLE 10

|  |  | $BL_{j-2}$ | $BL_{j-1}$ | $BL_j$ | $DL_j$ | $BL_{j+1}$ | $BL_{j+2}$ | $BL_{j+3}$ | $DL_{j+11}$ | Other Bit-lines | Reading on reading bit-lines |
|---|---|---|---|---|---|---|---|---|---|---|---|
|  | Stand By | HZ | HZ | HZ | HZ | HZ | HZ | HZ | HZ | HZ |  |
| Read on $BLj-2$ | Pre-charge | $V_{dd}$ | 0 | 0 | 0 | 0 | $V_{dd}$ | $V_{dd}$ | $V_{dd}$ | HZ |  |
|  | Read | $V_{dd}$ | 0 | 0 | 0 | 0 | $V_{dd}$ | $V_{dd}$ | $V_{dd}$ | HZ | $BLj-2 \cdot BLj+2 \cdot BLj+3 \cdot DLj+1$ |
| Read on $BLj-1$ | Pre-charge | 0 | $V_{dd}$ | 0 | 0 | $V_{dd}$ | 0 | $V_{dd}$ | $V_{dd}$ | HZ |  |
|  | Read | 0 | $V_{dd}$ | 0 | 0 | $V_{dd}$ | 0 | $V_{dd}$ | $V_{dd}$ | HZ | $BLj-1 \cdot BLj+1 \cdot BLj+3 \cdot DLj+1$ |
| Read on $BLj$ | Pre-charge | 0 | 0 | $V_{dd}$ | 0 | $V_{dd}$ | $V_{dd}$ | 0 | $V_{dd}$ | HZ |  |
|  | Read | 0 | 0 | $V_{dd}$ | 0 | $V_{dd}$ | $V_{dd}$ | 0 | $V_{dd}$ | HZ | $BLj \cdot BLj+1 \cdot BLj+2 \cdot DLj+1$ |

Figure 9:
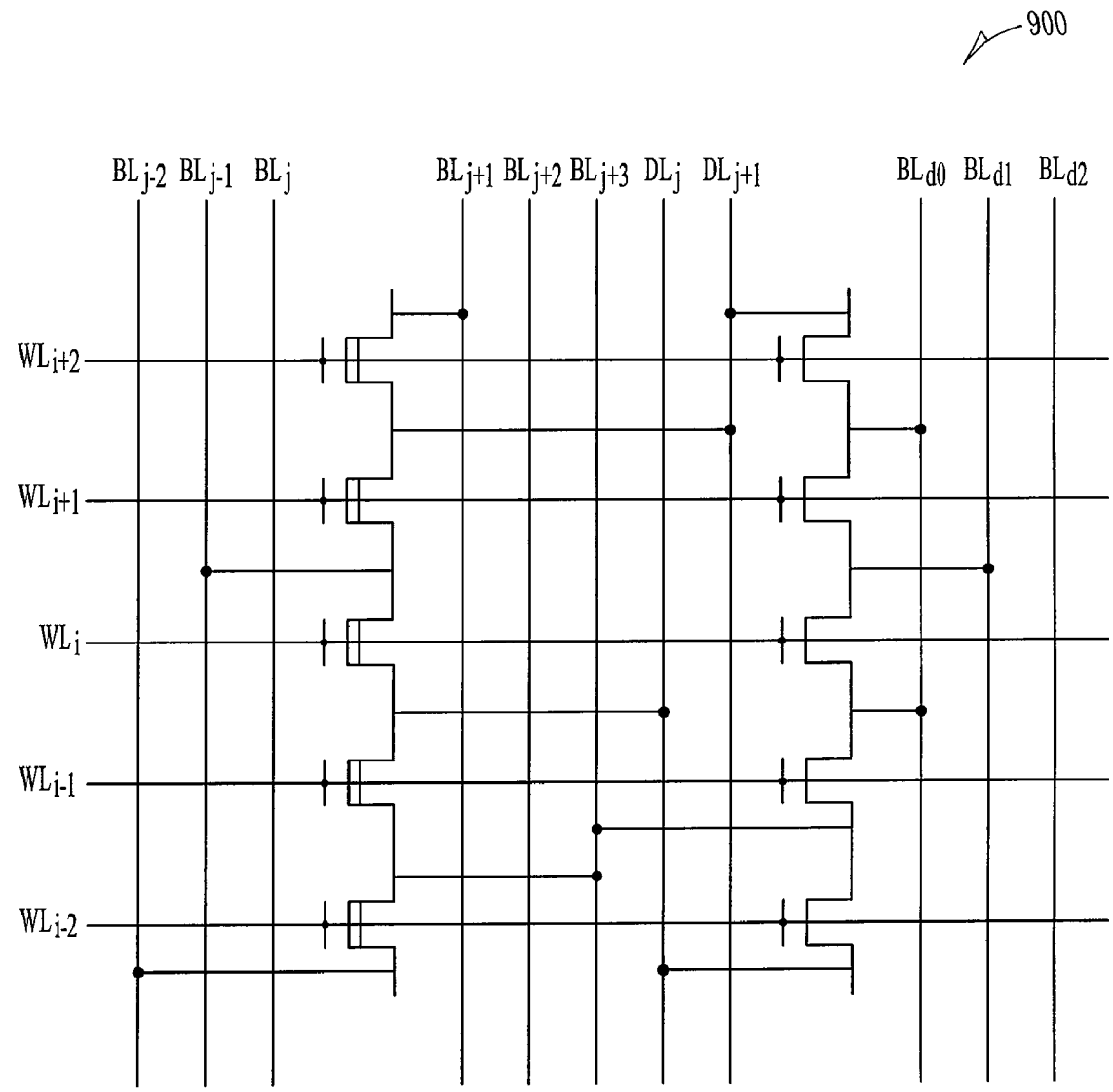
FIG. 9 depicts example features of a ROM memory array having n=3 shared bit-lines per bit-cell, according to the teachings of various embodiments.

FIG. 9 depicts features of a ROM memory array 900 with the contents of Table 7 and the programming of Tables 3A and 3B, according to various embodiments. ROM memory 900 includes three bit-lines per bit-cell. ROM memory 900 includes word-lines $WL_{i+2}, WL_{i+1}, WL_i, WL_{i-1}, WL_{i-2}$, and bit-lines $BL_{j-2}, BL_{j-1}, BL_j, BL_{j+1}, BL_{j+2}$, and $BL_{j+3}$. In FIG. 9, $BL_{d0}, BL_{d1}$, and $BL_{d2}$ are added bit-lines used to program and read the last bit-cells (associated with $BL_{j+1}, BL_{j+2}$ and $BL_{j+3}$) on each word-line. $DL_j$ and $DL_{j-3}$ are added bit-line used to program and read the first bit-cells (associated with $BL_{j-2}, BL_{j-1}$ and $BL_j$) and the last bit-cells on each word-line. There are 5 added bit-lines for memory array shown in FIG. 9.

sense amplifiers and the target word-line are deactivated. Reading ends when all the bit-lines are set back to a high impedance state.

Various embodiments are not limited by the examples discussed herein. Embodiments for a ROM having a memory array with shared bit-lines may be based on a standard transistor by structuring a plurality of bit-lines in a shared arrangement with respect to other standard transistors in the memory array. Each bit-cell may correspond to n bit-lines, for $n \geq 1$, and be associated with additional bit-lines. Each bit-line, associated and added, may be shared between two bit-cells. Each bit-cell stores n bits, which corresponds to the number of bit-lines assigned to a bit-cell. Each bit-cell stores n bits using $2^n$ bit-lines, where the $2^n$ bit-lines include the n associated bit-lines, the n adjacent existing (or added for the first and/or the last bit-cell on each word line, depending on the location of the bit-lines) first neighbors bit-lines, and l added bit-lines, $l=2^n-2*n$. Thus, the n bits are stored in one bit-cell using $2*n$ existing bit-lines and $l=2^n-2*n$ added bit-lines. Each bit-cell is attached to its n associated bit-lines, n adjacent existing bit-lines and l added bit-lines. Existing bit-lines refers to bit-lines correlated to bit-cells and the number of shared bit-lines correlated to stored data.

In terms of bit-lines, each n existing bit-lines are used to store $2^n$ data in two bit-cells, except for the first and/or the last bit-cell on each word-line, depending on the location of the bit-lines. Each existing bit-lines is shared between two bit-cells, except for the first and/or the last bit-cell on each word-line, depending on the location of the bit-lines. Each added bit-line is shared between two bit-cells, except for the first and/or the last bit-cell on each word-line, depending on the location of the bit-lines. The associated bit-lines of each bit-cell could be located either on the left or on the right side of the bit-cell or on each side of the bit-cell. The number of added bit-lines for the whole memory array when there are j bit-cells per word-line is $j\times(2^{n-1}-n)+n$ if j is an exponent of 2 and $(j+1)\times(2^{n-1}-n)/2+n$ if not.

Each bit stored in each bit-cell is read through $m=2^{n-1}$ reading bit-lines (n existing bit-lines and l/2 added bit-lines). To program a "1" in one procedure, the drain (or the source) of the target transistor may be connected to any target reading bit-line and the source (or the drain) of the target transistor is connected to another, or to the same, target reading bit-line. To program a "1" in another manner, neither the source nor the drain of the target transistor is connected to any target reading bit-line. To program a "1" in another manner, both the drain and the source are connected to the same bit-line attached to the target transistor. To program a "0," the drain (or the source) of the target transistor is connected to any target read bit-line and the source or the drain is connected to any not reading bit-line attached to the target transistor.

In various embodiments, the transistors are arranged in columns such that the columns may be referenced as even and odd column with the transistors of the bit-cells in the columns referenced as even and odd transistor corresponding to the column in which they are disposed. The even transistors may be configured different from the odd transistors with the even transistors configured substantially the same and the odd transistors configured substantially the same. The odd and even transistors in the memory array may differ by their width, length, threshold voltage, $SV_{th}/HV_{th}$, or other parameter that regulates current flow in the transistor. If the difference between transistors of two adjacent bit-cells on the same row is the width of each one, there is no overhead in operation and fabrication of the ROM array. If two bit-lines are associated to each bit-cell, n=2, l=0 and m=2, then, each bit-cell stores two bits and is attached to four existing bit-lines and each bit-line is shared between two bit-cells. So with n=2, l=0 and m=2, there is no added bit-line in the memory array, except for the first and/or the last bit-cell on each word-line, depending on the location of the bit-lines. When the number of the associated bit-lines per bit-cell exceeds 2, there are added bit-lines, 2 added bit-lines for 3 bit-lines per bit-cell, and the overhead becomes a factor in operation and fabrication of the ROM having a memory array with shared bit-lines.

System

Figure 10:
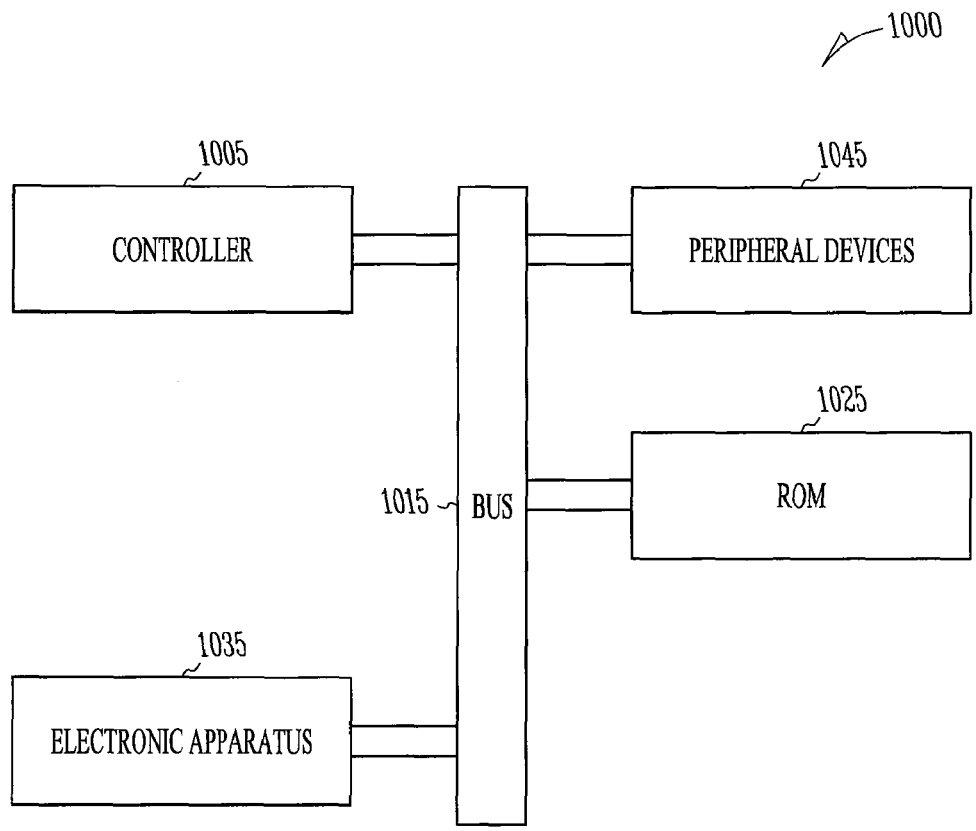
FIG. 10 shows a block diagram of an example system including a controller and a read only memory having a memory array with shared bit-lines, according to the teachings of various embodiments.

FIG. 10 shows a block diagram of a system 1000 having a controller 1005 and a read only memory 1025 having a memory array with shared bit-lines. In various embodiments, the memory array with shared bit-lines of ROM 1025 may be implemented in an architecture in which the memory array is arranged and the shared arrangements are based on sharing n bit-lines. The memory array may be arranged according to any of various embodiments similar to those described herein.

System 1000 may be formed in various manners coupling the individual components of system 1000 together or integrating the components into one or a number of units using conventional techniques. In an embodiment, system 1000 also includes an electronic apparatus 1035 and a bus 1015, where bus 1015 provides electrical conductivity between controller 1005 and electronic apparatus 1035 and between controller 1005 and ROM 1025. In an embodiment, bus 1015 includes an address bus, a data bus, and a control bus, each independently configured. In an alternative embodiment, bus 1015 uses common conductive lines for providing one or more of address, data, or control, the use of which is regulated by controller 1005. In an embodiment, electronic apparatus 1035 includes additional ROM devices and/or other memory types, such as but not limited to dynamic access memory (DRAM), static random access memory (SRAM), synchronous dynamic random access memory (SDRAM), synchronous graphics random access memory (SGRAM), double data rate dynamic ram (DDR), and double data rate (SDRAM). In an embodiment, additional peripheral device or devices 1045 are coupled to bus 1015. In an embodiment, peripheral devices 1045 include displays, imaging devices, printing devices, wireless devices, additional storage memory, control devices that may operate in conjunction with controller 1005. In an embodiment, controller 1005 is a processor. In an embodiment, system 1000 includes, but is not limited to, fiber optic systems or devices, electro-optic systems or devices, optical systems or devices, imaging systems or devices, and information handling systems or devices such as wireless systems or devices, telecommunication systems or devices, and computers.

Figure 11:
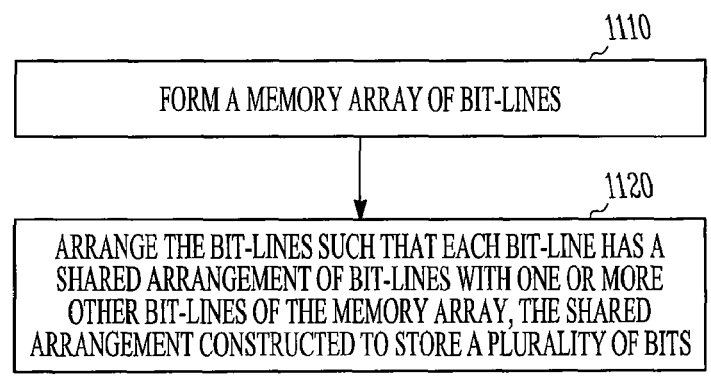
FIG. 11 shows features of an embodiment of a method to form a read only memory having shared bit-lines, according to the teaching of various embodiments.

FIG. 11 shows features of an embodiment of a method to form a read only memory, according to the teaching of various embodiments. At 1110, a memory array of bit-lines is formed. The array of bit-lines may be formed to include n bit-lines, for $n \geq 1$, per bit-cell and additional bit-lines, where the number of additional bit-lines depends on the value of n.

At 1120, the bit-lines are arranged such that each bit-line has a shared arrangement of bit-lines with one or more other bit-lines of the memory array. The shared arrangement is constructed to store a plurality of bits. The storage of data is provided by connecting various bit-lines to a corresponding transistor in a bit-cell. The gate of the transistor is coupled to a word-line disposed as a row of the memory array. The various bit-lines are attached to the transistor, for each bit-cell disposed in a row, such that each bit-cell is assigned to a shared arrangement to store n bits, for $n \geq 1$. $2^n$ bit-lines may be used, where the $2^n$ bit-lines includes bit-lines associated with the transistor and bit-lines associated with an adjacent transistor in the same row.

The transistor of each bit-cell may be formed such that the transistor in the bit-cell has a structure different from the transistor of an adjacent bit-cell coupled to the same word-line. The transistor of each bit-cell in a column may be formed having substantially a structure common to each transistor in the same column. In forming the transistors, the difference between the transistors in adjacent cells coupled to the same word-line includes forming the transistors with differences in one or more of a channel width, a channel length, a threshold voltage, and other parameters that affect the current flow in a transistor.

Various structures, according to the teachings with respect to the embodiments discussed herein, can be constructed as ROM devices in integrated circuits using conventional techniques. Various process techniques applied to other memory types, such as DRAMs, static random access memory (SRAM), synchronous dynamic random access memory (SDRAM), synchronous graphics random access memory (SGRAM), double data rate dynamic ram (DDR), and double data rate (SDRAM), may be employed to fabricate various embodiments for a ROM and the apparatus and/or systems for which the ROM is constructed. The ROM may be formed on a substrate as an individual integrated circuit. The ROM may be formed on a substrate as a component of a device or system formed on an individual integrated circuit. The ROM may be formed on a substrate with a controller that controls the access to the ROM memory device and that provides the data stored in the ROM to other devices or systems.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    a read only memory having an array of bit-lines arranged such that each bit-line has a shared arrangement with one or more other bit-lines to store a plurality of bits, wherein the array includes a plurality of bit-cells, each bit-cell correlated to a different plurality of the bit-lines, the different plurality of the bit lines including a shared arrangement, and each bit-cell coupled to a word line to access the stored plurality of bits, wherein the array is arranged with each bit-cell as an intersection of a row and a column of bit-cells, each bit-cell including a transistor having a gate coupled to the word line, each word line arranged as one row, the transistor of each bit-cell being structured different from the transistor of an adjacent bit-cell coupled to the same word line.

2. The apparatus of claim 1, wherein the transistor of each bit-cell in an even column has a structure common to each transistor in the other bit-cells in the even column and the transistor of each bit-cell in an odd column has a structure common to each transistor in the other bit-cells in the odd column.

3. The apparatus of claim 1, wherein the difference between the transistors in adjacent cells couple to the same word line includes difference in one or more of a channel width, a channel length, or a threshold voltage.

4. A method comprising:
    forming a read only memory including:
        forming a memory array of bit-lines;
        arranging the bit-lines such that each bit-line has a shared arrangement of bit-lines with one or more other bit-lines of the memory array, the shared arrangement to store a plurality of bits,
        providing a plurality of bit-cells for the memory array of bit-lines;
        forming a word line connected to a gate of a transistor in a bit-cell for each bit-cell disposed in a row of the memory array; and
        attaching a plurality of bit-lines to the transistor, for each bit-cell disposed in a row, such that each bit-cell is assigned to a shared arrangement to store n bits using $2^n$ bit-lines, n being greater than or equal to two.

5. The method of claim 4, further forming the transistor of each bit-cell such that the transistor in the bit-cell has a structure different from the transistor of an adjacent bit-cell coupled to the same word line.

6. A method comprising:
    providing an array having a plurality of bit-lines and a plurality of bit-cells;
    associating a set of the bit-lines to each bit-cell such that each bit-cell has associated bit-lines different from associated bit-lines of the other bit-cells;
    assigning to each bit-cell the associated bit-lines of an adjacent bit-cell; and connecting to a selected bit-cell one or more of its associated bit-lines or connecting to the selected bit-cell one or more of the assigned associated bit-lines of the adjacent bit-cell to store one or more data bits, wherein providing an array having a plurality of bit-lines and a plurality of bit-cells includes providing bit-cells along a row such that a transistor in a bit-cell has physical properties different from a transistor in an adjacent cell along the row.

* * * * *

UNITED STATES PATENT AND TRADEMARK OFFICE
CERTIFICATE OF CORRECTION

PATENT NO.       : 7,791,921 B2
APPLICATION NO.  : 12/136400
DATED            : September 7, 2010
INVENTOR(S)      : Salwa B. Alami et al.

It is certified that error appears in the above-identified patent and that said Letters Patent is hereby corrected as shown below:

In column 5, line 18, delete "$DL_{+1}$" and insert -- $DL_{j+1}$ --, therefor.

In column 6, line 50, delete "$B_j$," and insert -- $BL_j$, --, therefor.

In column 17, line 64, delete "$DL_{j-3}$" and insert -- $DL_{j+1}$ --, therefor.

In column 22, line 15, in Claim 4, delete "bits," and insert -- bits; --, therefor.

Signed and Sealed this

Sixteenth Day of November, 2010

David J. Kappos
*Director of the United States Patent and Trademark Office*